US012635360B2

(12) United States Patent     (10) Patent No.: US 12,635,360 B2

Kim et al.     (45) Date of Patent: May 19, 2026

(54) DISPLAY DEVICE INCLUDING CUTOUT PORTION SEPARATING PROTRUSION PATTERNS AND METHOD OF MANUFACTURING THE SAME

(71) Applicant: Samsung Display Co., LTD., Yongin-si (KR)

(72) Inventors: Dong Won Kim, Seoul (KR); Gyu Jeong Lee, Anyang-si (KR); Myung Hee Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 550 days.

(21) Appl. No.: 18/068,348

(22) Filed: Dec. 19, 2022

(65) Prior Publication Data

US 2023/0225158 A1    Jul. 13, 2023

(30) Foreign Application Priority Data

Jan. 10, 2022    (KR) ........................ 10-2022-0003198

(51) Int. Cl.
     *H10K 59/12*      (2023.01)
     *H10H 29/14*      (2025.01)
     (Continued)

(52) U.S. Cl.
     CPC ......... *H10K 59/124* (2023.02); *H10H 29/142* (2025.01); *H10K 50/844* (2023.02);
     (Continued)

(58) Field of Classification Search
     CPC .. H10K 50/844; H10K 50/841; H10K 59/124; H10K 59/40; H10K 59/121;
     (Continued)

(56) References Cited

U.S. PATENT DOCUMENTS 10,939,547 B2 *   3/2021   Lee ...................... H05K 1/0313
11,825,702 B2 *   11/2023   Song ................... H10K 59/873
(Continued)

FOREIGN PATENT DOCUMENTS

CN      112510066 A *   3/2021   ........... H10K 59/124
CN      113764486 A *   12/2021   ............. H10K 59/12
(Continued)

OTHER PUBLICATIONS

Notice of Allowance issued Feb. 4, 2026 by the Ministry of Intellectual Property (Republic of Korea) for corresponding Korean Patent Application No. KR 10-2022-0003198, 2 pages.

*Primary Examiner* — Ida M Soward

(74) *Attorney, Agent, or Firm* — Womble Bond Dickinson (US) LLP

(57)      ABSTRACT

A display device and a method of manufacturing the display device are provided. The display device includes a substrate including a main portion and a plurality of protrusion patterns protruding outwardly from an edge of the main portion, a display layer on each of the protrusion patterns, a first insulating layer covering the display layer and a second insulating layer on the first insulating layer. Adjacent protrusion patterns are separated by a cutout portion and side surfaces of the adjacent protrusion patterns face each other. The first insulating layer includes adjacent first insulating layers on the adjacent protrusion patterns that face each other and are separated by the cutout portion. The second insulating layer is on a top surface of the first insulating layer on each of the protrusion patterns, and is not on a side surface of the display layer.

16 Claims, 33 Drawing Sheets

(51) Int. Cl.
    *H10K 50/844*      (2023.01)
    *H10K 59/124*     (2023.01)
    *H10K 59/40*      (2023.01)
    *H10K 59/122*     (2023.01)

(52) U.S. Cl.
    CPC ......... *H10K 59/1201* (2023.02); *H10K 59/40*
    (2023.02); *H10K 59/122* (2023.02)

(58) Field of Classification Search
    CPC ...... H10K 59/873; H10K 59/12; H10K 59/35;
           H10K 59/122; H10K 77/111; H10H
                             29/142
    See application file for complete search history.

(56)           References Cited

U.S. PATENT DOCUMENTS

| | | | |
|---|---|---|---|
| 11,951,722 B2 | 4/2024 | Hwang et al. | |
| 2018/0088393 A1* | 3/2018 | Li | ............................ G09G 5/10 |
| 2018/0356668 A1* | 12/2018 | Koide | ................. G02F 1/13338 |
| 2021/0319756 A1* | 10/2021 | Kim | ..................... G09G 3/3225 |
| 2021/0384465 A1* | 12/2021 | Park | ..................... H10K 59/873 |
| 2022/0005877 A1* | 1/2022 | Seo | ....................... H10K 71/135 |
| 2022/0013746 A1* | 1/2022 | Joo | ....................... H10K 59/873 |
| 2022/0052141 A1* | 2/2022 | Lee | ....................... H10K 50/822 |
| 2022/0077242 A1* | 3/2022 | Yoon | .................... G06F 1/1637 |
| 2022/0093897 A1* | 3/2022 | Lee | ......................... H10K 59/12 |
| 2023/0094306 A1 | 3/2023 | Park et al. | |
| 2024/0262072 A1 | 8/2024 | Hwang et al. | |

FOREIGN PATENT DOCUMENTS

| | | | | |
|---|---|---|---|---|
| KR | 10-2021-0148550 A | 12/2021 | | |
| KR | 10-2021-0151634 A | 12/2021 | | |
| KR | 20210149279 A | * | 12/2021 | .......... H10D 86/441 |
| KR | 10-2023-0044046 A | 4/2023 | | |

* cited by examiner

DA: FS, SS, CS

SUB: DA1, DA2, NDA
DA1: MS, BS

DA2 : CP,CG

DISL : TFTL,EML,TFEL
170 : 171,172,173
PX1 : ST1,170

DISL : TFTL,EML,TFEL
170 : 171,172,173
PX1 : ST1,170

DISL : TFTL,EML,TFEL
170 : 171,172,173
PX1 : ST1,170

PX2 : ST2,270

DISL : TFTL,EML,TFEL
170 : 171,172,173
PX1 · ST1,170

PX2 : ST2,270

DISL : TFTL,EML,TFEL
170 : 171,172,173
PX1   ST1,170

PX2 : ST2,270

DISL : TFTL,EML,TFEL
170 : 171,172,173
PX1 : ST1,170

DISL : TFTL,EML,TFEL
170 : 171,172,173
PX1 : ST1,170

DISPLAY DEVICE INCLUDING CUTOUT PORTION SEPARATING PROTRUSION PATTERNS AND METHOD OF MANUFACTURING THE SAME

CROSS-REFERENCE TO RELATED APPLICATION

This application claims priority to and the benefit of Korean Patent Application No. 10-2022-0003198, filed on Jan. 10, 2022 in the Korean Intellectual Property Office, the entire content of which is incorporated by reference herein.

BACKGROUND

1. Field

Aspects of embodiments of the present disclosure relate to a display device and a method of manufacturing the same.

2. Description of the Related Art

As the information society develops, the demand for display devices for displaying images is increasing in various forms. For example, display devices have been applied to various electronic devices, such as smartphones, digital cameras, laptop computers, navigation devices, and smart televisions.

Display devices include light-receiving display devices, such as liquid crystal display devices, field emission display devices, light emitting display devices, and the like. Light emitting display devices, such as organic light emitting display devices, include organic light emitting elements, whereas inorganic light emitting display devices include inorganic light emitting display devices such as inorganic semiconductors, micro light emitting display devices including micro light emitting elements, and/or the like.

As display devices are applied to various electronic devices, display devices having various designs are used. For example, the display device may display an image not only on a front portion thereof but also on bending portions bent at each of four side edges of the front portion and corner portions disposed between the respective bending portions.

SUMMARY

Aspects of the present disclosure provide a display device capable of stably forming a thin film and a touch panel on a display panel by forming a planarization layer when a corner portion of the display panel includes cutout portions and protrusion patterns.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device may include a substrate including a main portion and a plurality of protrusion patterns protruding outwardly from an edge of the main portion, a display layer on each of the protrusion patterns, a first insulating layer covering the display layer, and a second insulating layer on the first insulating layer, wherein adjacent protrusion patterns of the plurality of protrusion patterns are separated by a cutout portion therebetween in a plan view and side surfaces of the adjacent protrusion patterns face each other, wherein the first insulating layer covers a top surface of the display layer on each of the protrusion patterns, wherein the first insulating layer includes adjacent first insulating layers on the adjacent protrusion patterns that face each other and are separated by the cutout portion therebetween in the plan view, the second insulating layer is on a top surface of the first insulating layer on each of the protrusion patterns, and the second insulating layer is not on a side surface of the display layer.

In one or more embodiments, the first insulating layer may further cover the side surface of the display layer on each of the protrusion patterns.

In one or more embodiments, the cutout portion may extend in a direction parallel to an extension direction of the adjacent protrusion patterns adjacent to the cutout portion.

In one or more embodiments, the display layer may further be on the main portion, the first insulating layer may be on the top surface of the display layer on the main portion, and the second insulating layer may be on the first insulating layer on the main portion.

In one or more embodiments, the display layer may include a plurality of pixels, and an arrangement of the plurality of pixels of the display layer on the main portion and an arrangement of the plurality of pixels on the plurality of protrusion patterns may be different from each other.

In one or more embodiments, the display layer may include a thin film transistor layer and a light emitting element on the thin film transistor layer.

In one or more embodiments, the display layer may include one or more inorganic insulating layers and one or more organic insulating layers.

In one or more embodiments, the display layer may further include a dam portion around the plurality of pixels on the protrusion patterns, the dam portion including at least one insulating layer among the one or more inorganic insulating layers and the one or more organic insulating layers.

In one or more embodiments, the display layer may further include a planarization layer on an upper side of the light emitting element, and the first insulating layer may be at least partially in contact with a top surface of the planarization layer.

In one or more embodiments, the display device may further include a touch electrode, at least a portion of the touch electrode may be on the second insulating layer on the main portion.

In one or more embodiment, the touch electrode may not be on the protrusion patterns.

In one or more embodiments, the first insulating layer may cover one side surface of each of the plurality of protrusion patterns.

In one or more embodiments, the first insulating layer may include a first area covering the top surface of the display layer and a second area covering the side surface of the display layer, and an edge of a top surface of the second insulating layer may be aligned with a boundary between the first area and the second area of the first insulating layer.

In one or more embodiments, the main portion may include a plurality of edges and corner portions where the plurality of edges meet, and the plurality of protrusion patterns may protrude from the corner portions of the main portion.

In one or more embodiments, the substrate may include a flat portion positioned in a center of the main portion, a single bending portion bent downwardly from each edge of the flat portion, and a multi bending portion at a position where the single bending portions adjacent to each other meet, and the protrusion patterns may be positioned in the multi bending portion.

In one or more embodiments, the side surfaces of the adjacent protrusion patterns may be in contact with each other.

According to another aspect of the present disclosure, a method of manufacturing a display device may include providing a display panel including a substrate including a main portion and a plurality of protrusion patterns protruding outwardly from an edge of the main portion, a display layer on each of the protrusion patterns, and a first insulating layer covering the display layer, wherein adjacent protrusion patterns of the plurality of protrusion patterns are separated by a cutout portion therebetween in a plan view and side surfaces of the adjacent protrusion patterns face each other, wherein the first insulating layer covers a top surface and a side surface of the display layer on each of the protrusion patterns, and wherein the first insulating layer includes adjacent first insulating layers on the adjacent protrusion patterns that face each other and are separated by the cutout portion therebetween in the plan view, disposing a sacrificial layer in the cutout portion and in a space above the cutout portion, the space being defined by the adjacent first insulating layers on the adjacent protrusion patterns that face each other and are separated by the cutout portion therebetween in the plan view, forming a second insulating layer on the first insulating layer and the sacrificial layer, selectively removing the second insulating layer on the sacrificial layer, and removing the sacrificial layer.

In one or more embodiments, the method of manufacturing a display device may further comprise disposing a planarization layer on an upper side of a light emitting element in the display layer.

According to one or more embodiments of the present disclosure, a method of manufacturing a display device comprises providing a display panel including a substrate including a main portion and a plurality of protrusion patterns protruding outwardly from an edge of the main portion, and a display layer on each of the protrusion patterns, wherein adjacent protrusion patterns of the plurality of protrusion patterns are separated by a cutout portion therebetween in a plan view and side surfaces of the adjacent protrusion patterns face each other, disposing a planarization layer on an upper side of a light emitting element in the display layer and disposing a sacrificial layer in a space defined by the side surfaces of the adjacent protrusion patterns that face each other and are separated by the cutout portion therebetween in the plan view, disposing an insulating layer on the planarization layer and the sacrificial layer, selectively removing the insulating layer on the sacrificial layer, and removing the sacrificial layer.

In one or more embodiments, the sacrificial layer may not be in a space above the cutout portion.

According to the display device and the method of manufacturing the same according to the embodiments, the planarization layer may be formed on the dams of the protrusion patterns and the cutout portions included in the corner portions of the display panel, thereby stably forming the thin film and the touch panel on the display panel to provide the display device with improved reliability.

However, the effects of the embodiments are not restricted to the one set forth herein. The above and other effects of the embodiments will become more apparent to one of ordinary skill in the art to which the embodiments pertain.

BRIEF DESCRIPTION OF THE DRAWINGS

The above and other aspects, features and/or principles of the present disclosure will become more apparent through the detailed description of embodiments of the present disclosure with reference to the attached drawings, in which:

Figure 33:
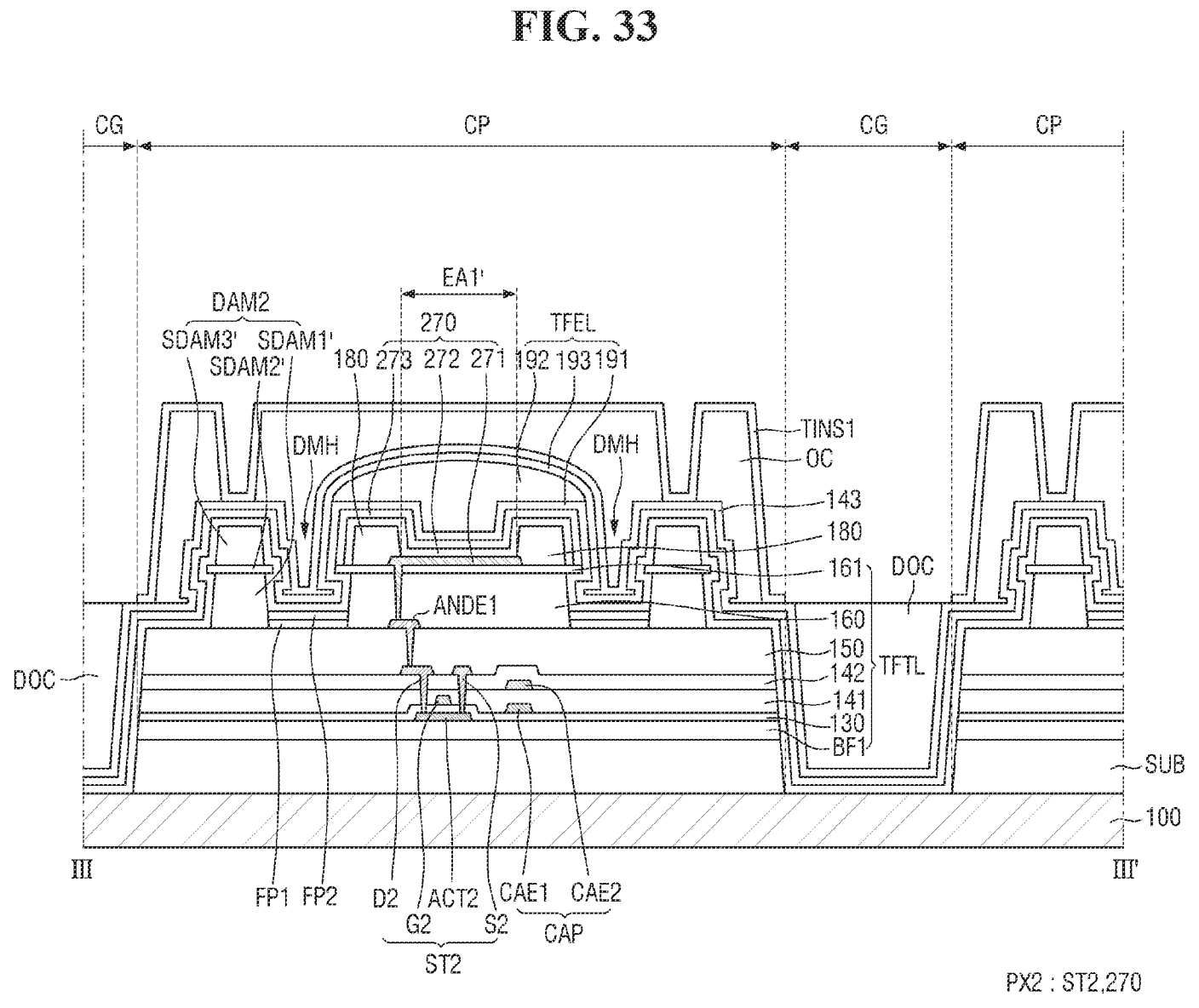

FIGS. 29 to 33 are cross-sectional views for describing the method of manufacturing the display device according to the embodiment of FIG. 28.

DETAILED DESCRIPTION

Figure 1:
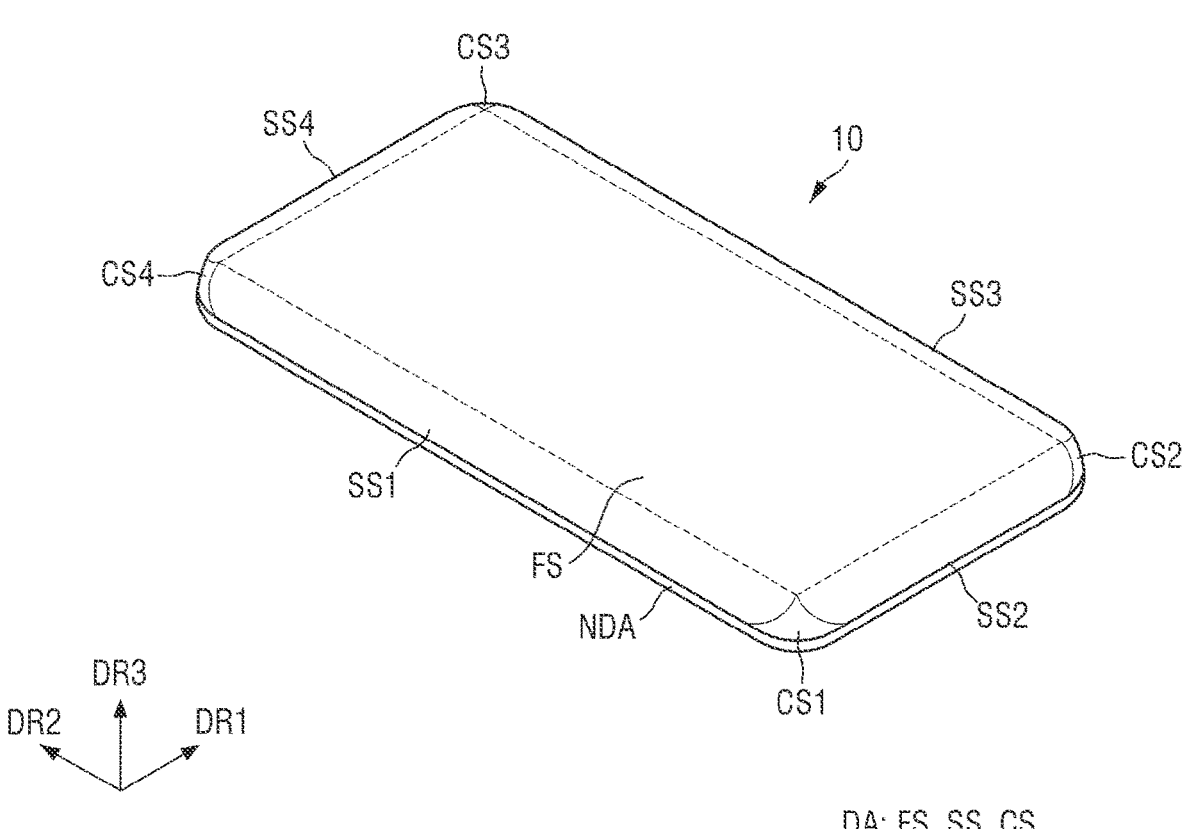
FIG. 1 is a perspective view of a display device according to one or more embodiments.

The present disclosure will now be described more fully hereinafter with reference to the accompanying drawings, in which illustrative embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Accordingly, processes, elements, and techniques that are not necessary to those having ordinary skill in the art for a complete understanding of the aspects and features of the present disclosure may not be described.

It will also be understood that when a layer is referred to as being "on," "connected to," or "coupled to" another layer or substrate, it can be directly on, connected to, or coupled to the other layer or substrate, or intervening layers may also be present. In addition, it will also be understood that when an element or layer is referred to as being "between" two elements or layers, it can be the only element or layer between the two elements or layers, or one or more intervening elements or layers may also be present. The same reference numbers indicate the same components throughout the specification, unless otherwise noted, and thus repeated description thereof may be omitted.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in detail with reference to the accompanying drawings.

Figure 2:
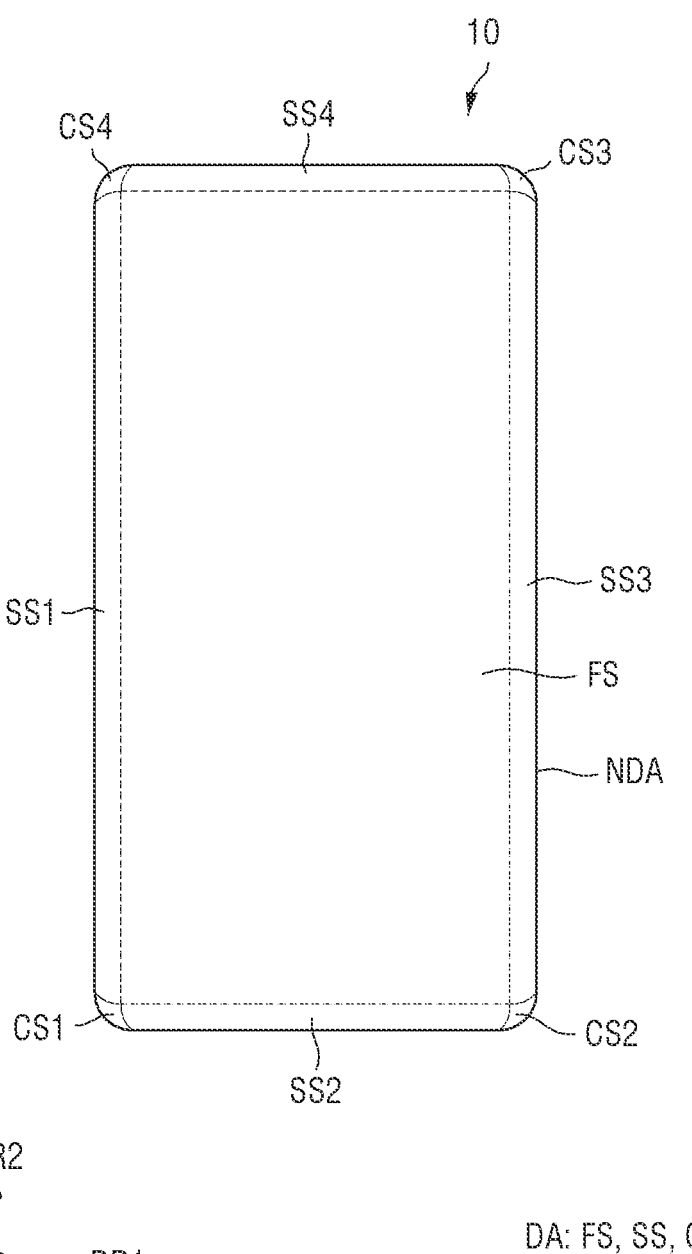
FIG. 2 is a plan view of the display device of FIG. 1.

FIG. 1 is a perspective view of a display device according to one or more embodiments, and FIG. 2 is a plan view of the display device of FIG. 1.

Referring to FIGS. 1 and 2, a display device 10 according to one or more embodiments of the present disclosure may display a screen or an image via a display area DA, and various devices may include the display area DA. For example, the display device 10 according to embodiments of the present disclosure may be applied to smartphones, mobile phones, tablet personal computers (PCs), personal digital assistants (PDAs), portable multimedia players (PMPs), televisions, game machines, wrist watch-type electronic devices, head-mounted displays, monitors of personal computers, laptop computers, car navigation systems, vehicle instrument boards, digital cameras, camcorders, external billboards, electric signs, medical devices, inspection devices, various home appliances such as refrigerators and washing machines, or Internet of Things (IoT) devices.

In a plan view, a short side of the display device 10 may extend in a direction parallel to a first direction DR1, and a long side of the display device 10 may extend in a direction parallel to a second direction DR2. A plan view, as used in the present specification, may correspond to a state in which the device or portion of the device is viewed in a third direction DR3. For example, the first direction DR1 and the second direction DR2 may intersect to be perpendicular to each other, and the first direction DR1 may be a horizontal direction of the display device 10 in the plan view, and the second direction DR2 may be a vertical direction of the display device 10 in the plan view. The third direction DR3 may be a direction perpendicular to the first direction DR1 and the second direction DR2, for example, the third direction DR3 may be a thickness direction of the display device 10.

The display device 10 may include a display area DA and a non-display area NDA.

The display area DA may display an image. The display area DA may include pixels and/or emission areas. The display area DA may include a front portion FS, side portions SS (SS1, SS2, SS3, and SS4), and corner portions CS (CS1, CS2, CS3, and CS4).

The front portion FS may be substantially flat across entire area, but is not limited thereto, and may include a convex or concave shape in the thickness direction (the third direction DR3) in at least some areas. The front portion FS may have a quadrangular shape having a short side in the first direction DR1 and a long side in the second direction DR2.

The display area DA may have a rounded shape near corners in the plan view. The display area DA may have a rounded polygonal shape near corners in the plan view. For example, as illustrated in FIG. 1, the display area DA may have a quadrangular shape with rounded corners, but is not limited thereto.

The side portions SS (SS1, SS2, SS3, and SS4) may extend outward from edges of the front portion FS and be bent at a suitable angle (e.g., a predetermined angle). For example, the side portions SS may be bent at an angle greater than or equal to 90 degrees and less than 180 degrees with respect to the front portion FS. When the front portion FS includes a quadrangular shape in the plan view, the side portions SS may include a first side portion SS1 and a third side portion SS3 extending from the front portion FS to one side and the other side in the first direction DR1 (e.g., one side and another side both extending from the front portion FS along the first direction DR1 on opposite sides of the front portion FS), respectively, and a second side portion SS2 and a fourth side portion SS4 extending from the front portion FS to one side and the other side in the second direction DR2 (e.g., one side and another side both extending from the front portion FS along the second direction DR2 on opposite sides of the front portion FS), respectively. The first to fourth side portions SS1, SS2, SS3, and SS4 may have substantially the same function or configuration except for positions thereof.

A side surface of each of the side portions SS (SS1, SS2, SS3, and SS4) may include a round shape (e.g., a curved shape) in the plan view, but is not limited thereto. For example, the side surfaces of one side and the other side of the first side portion SS1 in the second direction DR2 may have a round shape in the plan view, but are not limited thereto.

The first to fourth side portions SS1, SS2, SS3, and SS4 may extend from the front portion FS to have a suitable curvature (e.g., a predetermined curvature) and may have a round shape. The first to fourth side portions SS1, SS2, SS3, and SS4 may have a shape that is convex toward the outside of the display device 10. For example, the first side portion SS1 may include a first curvature, and the second side portion SS2 may include a second curvature. The third side portion SS3 may have a third curvature, and the fourth side portion SS4 may have a fourth curvature. The first to fourth curvatures may be the same as each other, but are not limited thereto, and the first to fourth curvatures may be different from each other, or only some of the first to fourth curvatures may be the same.

The corner portions CS may extend outwardly from each edge of the front portion FS and be bent at a suitable angle (e.g., a predetermined angle). When the corner portions CS are bent at the suitable angle (e.g., a predetermined angle), such an angle may be smaller than the angle at which the side portions SS are bent outwardly. However, the disclosure is not limited thereto.

The corner portions CS may be disposed between the side portions SS (SS1, SS2, SS3, and SS4) adjacent to each other. In other words, the first to fourth side portions SS1, SS2, SS3, and SS4 may be spaced apart from each other in at least some areas at regular intervals. The corner portions CS (CS1, CS2, CS3, and CS4) may be disposed in the areas where the first to fourth side portions SS1, SS2, SS3, and SS4 are spaced apart from each other.

For example, the first corner portion CS1 may be disposed between the first side portion SS1 and the second side portion SS2, the second corner portion CS2 may be disposed between the second side portion SS2 and the third side portion SS3, the third corner portion CS3 may be disposed between the third side portion SS3 and the fourth side portion SS4, and the fourth corner portion CS4 may be disposed between the fourth side portion SS4 and the first side portion SS1. The first to fourth corner portions CS1, CS2, CS3, and CS4 may have substantially the same function or configuration except for positions thereof.

Each of the first to fourth corner portions CS1, CS2, CS3, and CS4 may have a multi curvature (e.g., may have multiple different radii of curvature) and may have a round shape. For example, the first corner portion CS1 may be disposed between the first side portion SS1 and the second side portion SS2. In one or more embodiments, the first corner portion CS1 may include a multi curvature including the first curvature of the first side portion SS1 and the second curvature of the second side portion SS2. The above-described description of the first corner portion CS1 may also be applied to the second to fourth corner portions CS2, CS3, and CS4, respectively.

In addition, when a plurality of protrusion patterns CP (see, e.g., FIG. 4) included in the corner portion CS extend outward from the edge of the front portion FS and are bent, curvatures of the protrusion patterns CP may be different from each other, or some of the curvatures of the protrusion patterns CP may be the same. Accordingly, the corner portion CS may include a multi curvature including a plurality of curvatures. A more detailed description of the protrusion patterns CP will be described later.

Pixels may be disposed on the front portion FS and the side portions SS of the display device 10 as well as the corner portions CS, and a screen (e.g., an image) may be displayed thereon. Accordingly, when the display device 10 is viewed from the front, it may be recognized by a user as being displayed on an entire area of the display device 10. That is, it may be recognized by the user as substantially no bezel, and a more immersive screen may be provided.

Display may not be performed on the non-display area NDA. The non-display area NDA may not include pixels or emission areas. Signal lines or scan drivers for driving the pixels or the emission areas may be disposed in the non-display area NDA. The non-display area NDA may be disposed to surround (or be around) the display area DA. The non-display area NDA may be disposed outside the front portion FS and the side portions SS and outside the corner portions CS. The non-display area NDA may constitute a bezel area of the display device 10.

Figure 3:
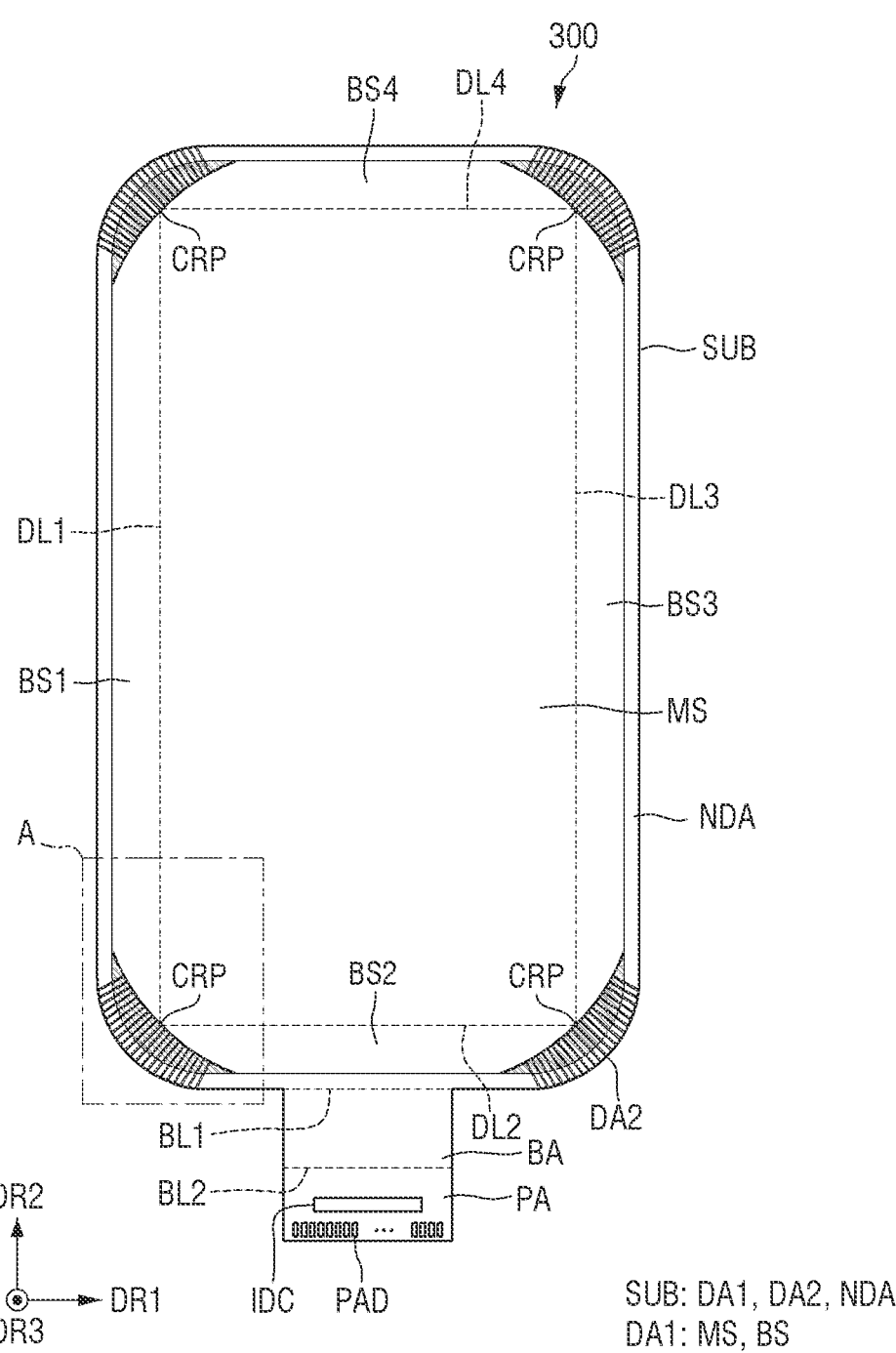
FIG. 3 is a development view of a display panel of the display device according to one or more embodiments.

FIG. 3 is a development view of a display panel of the display device according to one or more embodiments of the present disclosure.

The display device 10 according to one or more embodiments may include a display panel 300. The display panel 300 may be a flexible display panel. In other words, the display panel 300 may include a flexible substrate SUB in which at least a partial area thereof may be bent, folded, rolled, and/or stretched.

The substrate SUB may include a first display area DA1, a second display area DA2, and a non-display area NDA. Each of the first display area DA1 and the second display area DA2 may include a plurality of pixels, and in the non-display area NDA, no pixels are disposed, and lines for driving the pixels may be disposed. The non-display area NDA may be disposed outside the first display area DA1 and the second display area DA2, and may surround (or be around) the first display area DA1 and the second display area DA2 in the development view.

The first display area DA1 may include a main portion MS and bending portions BS (BS1, BS2, BS3, and BS4). The main portion MS may correspond to the front portion FS (see, e.g., FIG. 1) of the display device 10 (see, e.g., FIG. 1), and the bending portions BS (BS1, BS2, BS3, and BS4) may correspond to the side portions SS (see, e.g., FIG. 1) of the display device 10 (see, e.g., FIG. 1). The main portion MS may have a shape substantially corresponding to the front portion FS (see, e.g., FIG. 1) of the display device 10 (see, e.g., FIG. 1), and the bending portions BS (BS1, BS2, BS3, and BS4) may have shapes substantially corresponding to the side portions SS (see, e.g., FIG. 1) of the display device 10 (see, e.g., FIG. 1).

The bending portions BS (BS1, BS2, BS3, and BS4) may extend outward from edges of the main portion MS and may be bent at a suitable angle (e.g., a predetermined angle). Each of the first to fourth bending portions BS1, BS2, BS3, and BS4 may extend from the main portion MS and may be bent along bending lines DL1, DL2, DL3, and DL4, respectively. For example, the bending portions BS may be bent at an angle greater than or equal to 90 degrees and less than 180 degrees with respect to the main portion MS.

A cross point CRP of the bending lines DL1, DL2, DL3, and DL4 may be positioned between the first display area DA1 and the second display area DA2, or may be positioned on a boundary between the first display area DA1 and the second display area DA2. However, the present disclosure is not limited thereto, and the cross point CRP may be positioned in the first display area DA1 or may also be positioned in the second display area DA2.

The first to fourth bending portions BS1, BS2, BS3, and BS4 may include a generally trapezoidal shape in the development view, and in one or more embodiments, both side surfaces of the trapezoidal shape may include a round shape (e.g., a curved shape). In one or more embodiments, a length in which a side of the first bending portion BS1 on one side in the first direction DR1 extends in the second direction DR2 may be shorter than a length in which a side of the first bending portion BS1 on the other side in the first direction DR1 extends in the second direction DR2 in the development view. In the development view, side surfaces connecting both sides of the first bending portion BS1 may be positioned on one side and the other side of the first bending portion BS1 in the second direction DR2, and may include a round shape (e.g., a curved shape). However, the shape of the first bending portion BS1 in the development view is not limited thereto. The description of the first bending portion BS1 may also be applied to the second to fourth bending portions BS2, BS3, and BS4.

The second display area DA2 may be disposed between the bending portions BS (BS1, BS2, BS3, and BS4), e.g., between adjacent bending portions BS (BS1, BS2, BS3, and BS4). In other words, the first to fourth bending portions BS1, BS2, BS3, and BS4 may be spaced apart from each other in at least some areas at regular intervals. The second display area DA2 may be disposed in the areas where the first to fourth bending portions BS1, BS2, BS3, and BS4 are spaced apart from each other.

For example, the second display area DA2 may be disposed in at least one of the areas between the first bending portion BS1 and the second bending portion BS2, between the second bending portion BS2 and the third bending portion BS3, between the third bending portion BS3 and the fourth bending portion BS4, and between the fourth bending portion BS4 and the first bending portion BS1.

A shape of the second display area DA2 may correspond to the shape of the corner portion CS of the display device 10.

The display panel 300 may further include a bending area BA and a pad portion PA.

The bending area BA may extend from a lower side of the non-display area NDA in the development view. The bending area BA may be disposed between the non-display area NDA and the pad portion PA. A length of the bending area BA in the first direction DR1 may be shorter than the length of the non-display area NDA in the first direction DR1. The bending area BA may be bent along a first bending line BL1 on the lower side of the non-display area NDA.

The pad portion PA may extend downward from the bending area BA in the plan view. A length of the pad portion PA in the first direction DR1 may be substantially the same as the length of the bending area BA in the first direction DR1. The pad portion PA may be bent along a second bending line BL2 on a lower side of the bending area BA.

An integrated driving circuit IDC and pads PAD may be disposed on the pad portion PA. The integrated driving circuit IDC may be formed as an integrated circuit (IC). The integrated driving circuit IDC may be attached on the pad portion PA through an anisotropic conductive film or may be directly attached on the pad portion PA through an ultrasonic bonding method. In one or more embodiments, the integrated driving circuit IDC may be disposed on a circuit board disposed on the pads PAD of the pad portion PA.

The integrated driving circuit IDC may be electrically connected to the pads PAD of the pad portion PA. The integrated driving circuit IDC may receive digital video data and timing signals through the pads PAD of the pad portion PA. The integrated driving circuit IDC may convert the digital video data into analog data voltages and output the analog data voltages to data lines of the display areas DA1 and DA2.

Figure 4:
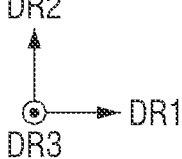
FIG. 4 is an enlarged view of area A of FIG. 3.

FIG. 4 is an enlarged view of area A of FIG. 3.

Referring to FIG. 4, the substrate SUB may include protrusion patterns CP. The protrusion patterns CP may protrude from the first display area DA1 of the substrate SUB. The protrusion patterns CP may protrude from at least one of the main portion MS and the bending portions BS of the first display area DA1 toward the outside of the first display area DA1. One end of each protrusion pattern CP may be connected to the first display area DA1. The non-display area NDA may be disposed at a side of the protrusion pattern CP opposite to the first display area DA1.

The protrusion patterns CP adjacent to each other may be spaced to be physically separated in at least some areas. Each protrusion pattern CP may be physically separated from the uppermost layer to the lowermost layer, in at least some areas.

The cutout portion CG may be positioned at a portion where the protrusion patterns CP adjacent to each other are physically separated. That is, a space may be provided between the protrusion patterns CP adjacent to each other by the cutout portion CG.

The other end of each protrusion pattern CP may be connected to the non-display area NDA. In other words, the display panel 300 may have the first display area DA1 and the non-display area NDA spaced apart from each other with the second display area DA2 interposed therebetween. The protrusion patterns CP of the second display area DA2 may be disposed in a space where the first display area DA1 and the non-display area NDA are spaced apart, and may connect the first display area DA1 and the non-display area NDA. However, the disclosure is not limited thereto. In one or more embodiments, the other end of each protrusion pattern CP may not be connected to the non-display area NDA and may be exposed to the outside without being connected to a separate structure.

The second display area DA2 may be disposed in the protrusion patterns CP between the first display area DA1 and the non-display area NDA. The non-display area NDA may be disposed for (e.g., may correspond to) each protrusion pattern CP, and the portions of the non-display area NDA disposed for each protrusion pattern CP may be separated from each other and spaced apart from each other in the development view.

As illustrated in FIG. 4, areas other than the portion where the protrusion patterns CP are connected to the first display area DA1 may be exposed. A length of each protrusion pattern CP in a direction in which each protrusion pattern CP protrudes from the first display area DA1 may be different. In the development view, the end of the first display area DA1 from which the plurality of protrusion patterns CP protrude may include a curved line, and in one or more embodiments, a direction in which each of the plurality of protrusion patterns CP protrudes may be different. However, the disclosure is not limited thereto.

The length of each protrusion pattern CP in a direction in which each protrusion pattern CP protrudes from the first display area DA1 may be greater than a width in a direction perpendicular to the protrusion direction.

A width of each of the protrusion patterns CP may decrease from the first display area DA1 toward the non-display area NDA. In one or more embodiments, each of the protrusion patterns CP may include a trapezoidal shape in a plan view in the development view, but is not limited thereto.

The plurality of protrusion patterns CP may face each other. In other words, the plurality of protrusion patterns CP may be spaced apart from each other with the cutout portion CG interposed therebetween, and side surfaces of the protrusion patterns CP may face each other. The plurality of protrusion patterns CP may be divided by the cutout portion CG. In the development view, an interval between the protrusion patterns CP adjacent to each other may increase from the first display area DA1 toward the non-display area NDA.

Figure 5:
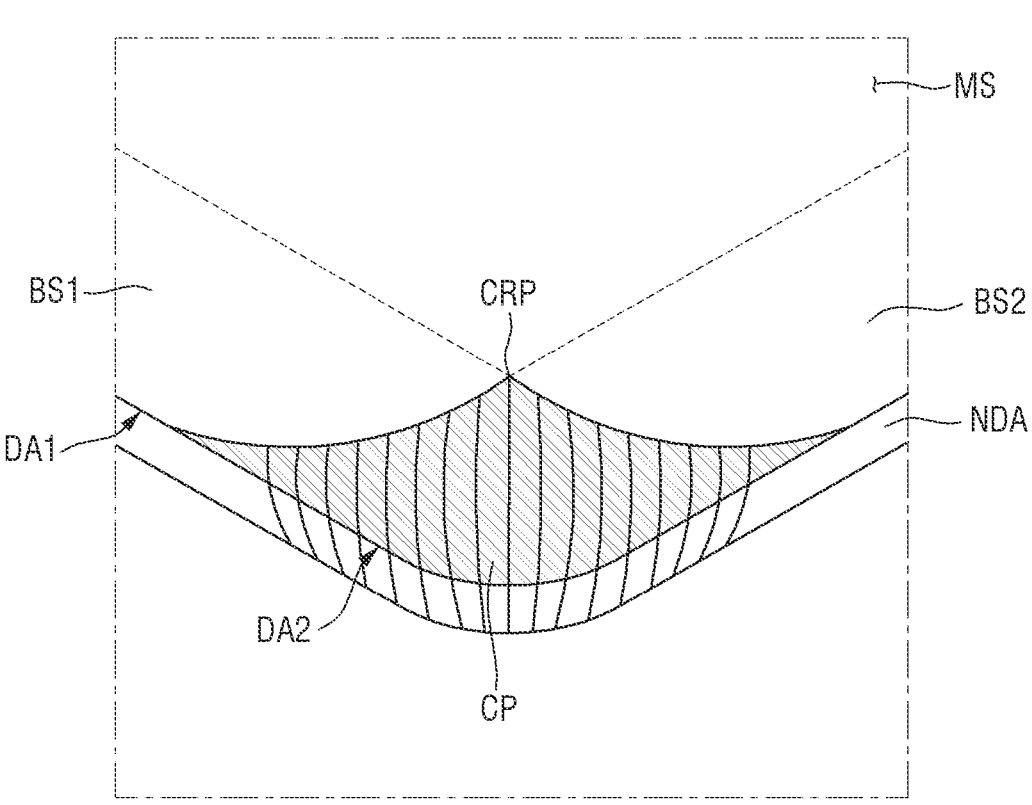
FIG. 5 is a partial perspective view of the display panel of the display device according to one or more embodiments.
Figure 5:
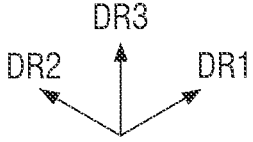

FIG. 5 is a partial perspective view of the display panel of the display device according to one or more embodiments of the present disclosure.

FIG. 5 illustrates one or more embodiments in which area A of FIG. 3 is bent. Referring to FIG. 5, when the protrusion patterns CP are bent, the interval between the protrusion patterns CP adjacent to each other may be reduced, and/or the protrusion patterns CP adjacent to each other may be in direct contact with each other. When the protrusion patterns CP adjacent to each other are in direct contact with each other, a physical boundary may be included between the protrusion patterns CP adjacent to each other. However, the disclosure is not limited thereto, and when the protrusion patterns CP are bent, the protrusion patterns CP adjacent to each other may overlap each other. Furthermore, when the protrusion patterns CP are bent, an interval between second pixels PX2 (see FIG. 7) disposed on each protrusion pattern CP may decrease.

In addition, the protrusion patterns CP positioned at the outermost portions of the plurality of protrusion patterns CP may be in direct contact with the bending portions BS1, BS2, BS3, and BS4 adjacent thereto when being bent. In one or more embodiments, a physical boundary may be included between the protrusion patterns CP and the first display area DA1 adjacent to the protrusion patterns CP and disposed in the bending portions BS1, BS2, BS3, and BS4.

When the protrusion patterns CP are bent, the protrusion patterns CP may have a multi curvature (e.g., may have multiple different radii of curvature) and may have a round shape because the protrusion patterns CP may include different curvatures when each bending portion BS and each protrusion pattern CP are bent. In other words, the protrusion patterns CP may have a multi curvature substantially the same as that included in the second display area DA2 and may have a round shape.

Figure 6:
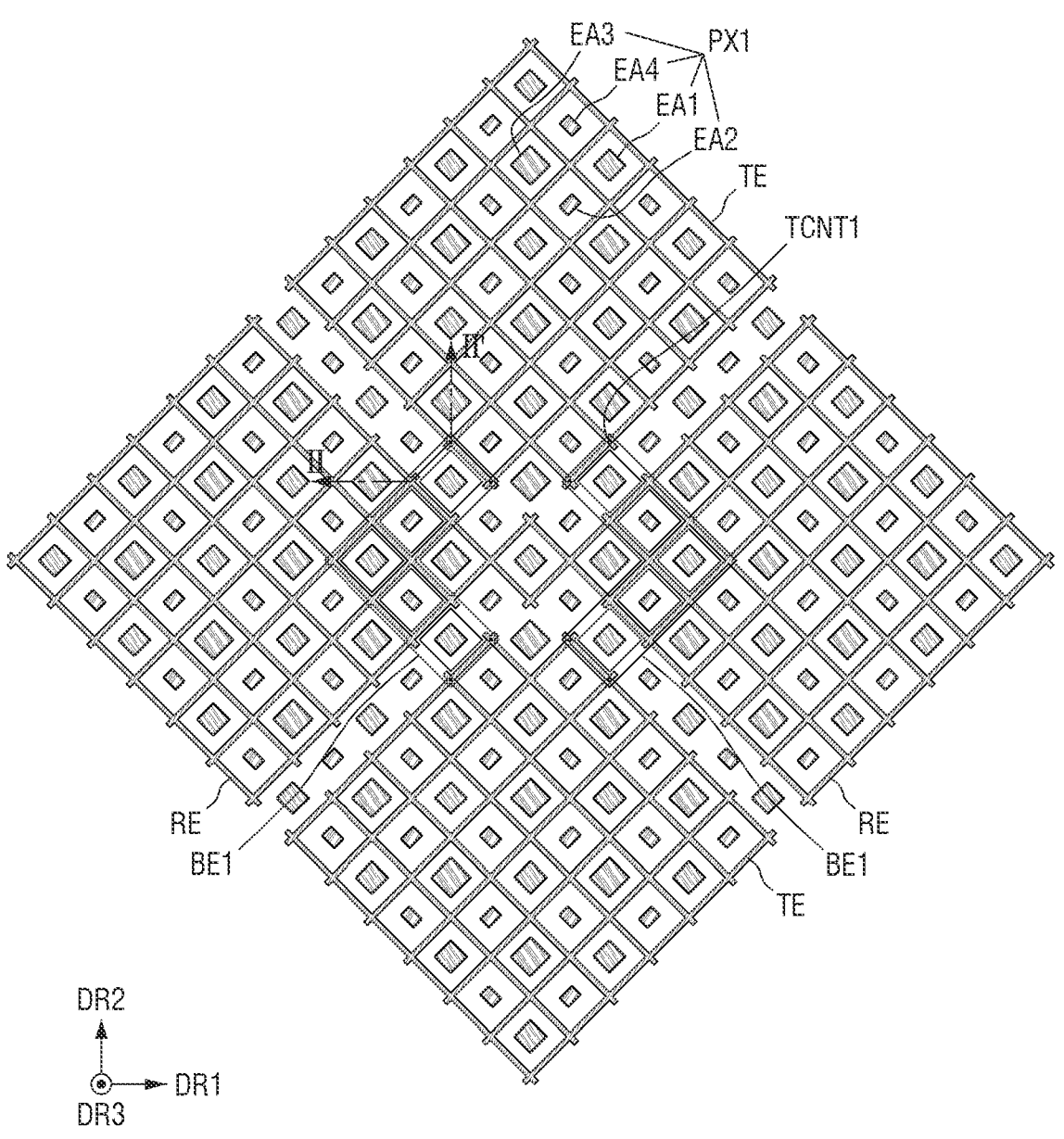
FIG. 6 is a layout view illustrating an example of a first display area of FIG. 3.

FIG. 6 is a layout view illustrating an example of a first display area of FIG. 3.

Referring to FIG. 6, driving electrodes TE and sensing electrodes RE may be electrically separated from each other. The driving electrodes TE and the sensing electrodes RE are disposed on the same layer, and may thus be spaced from each other. A gap may be formed between the driving electrode TE and the sensing electrode RE.

The sensing electrodes RE may be electrically connected to each other in the first direction DR1. The driving electrodes TE may be electrically connected to each other in the second direction DR2. In order to electrically separate the sensing electrodes RE and the driving electrodes TE at their crossing portions, the driving electrodes TE adjacent to each other in the second direction DR2 may be connected through connection electrodes BE1.

The connection electrodes BE1 are formed on a different layer from the driving electrodes TE and the sensing electrodes RE, and may be connected to the driving electrodes TE through first touch contact holes TCNT1. One end of one of the connection electrodes BE1 may be connected to one of the driving electrodes TE adjacent to each other in the second direction DR2 through the first touch contact holes TCNT1. The other end of the connection electrode BE1 may be connected to the other of the driving electrodes TE adjacent to each other in the second direction DR2 through the first touch contact holes TCNT1. The connection electrodes BE1 may overlap the sensing electrode RE in the third direction DR3. Because the connection electrodes BE1 are formed on a different layer from the driving electrodes TE and the sensing electrodes RE, the connection electrodes BE1 may be electrically separated from the sensing electrode RE, even if the connection electrodes BE1 overlap the sensing electrode RE in the third direction DR3.

The connection electrodes BE1 may be formed to be bent at least once. It has been illustrated in FIG. 6 that the connection electrodes BE1 are bent in a shape of a clamp ("<" or ">"), but the shape of the connection electrodes BE1 is not limited thereto. In addition, since the driving electrodes TE adjacent to each other in the second direction DR2 are connected to each other by a plurality of connection electrodes BE1, the driving electrodes TE adjacent to each other in the second direction DR2 may be electrically connected to each other even if any one of the connection electrodes BE1 is disconnected.

Each of the driving electrodes TE and the sensing electrodes RE may have a shape of a mesh structure or a net structure in the plan view. Since the driving electrodes TE and the sensing electrodes RE are formed on a fourth interlayer insulating layer (see, e.g., '144' in FIG. 8), a distance between a common electrode (see, e.g., '173' in FIG. 8) and the driving electrode TE or the sensing electrode RE is close. Therefore, a parasitic capacitance may be formed between the common electrode ('173' in FIG. 8) and the driving electrode TE or the sensing electrode RE. Since the parasitic capacitance is proportional to an overlapping area between the common electrode ('173' in FIG. 8) and the driving electrode TE or the sensing electrode RE, in one or more embodiments, the driving electrodes TE and the sensing electrodes RE have a shape of a mesh structure or a net structure in the plan view in order to reduce the parasitic capacitance.

The first display area DA1 may include first pixels PX1 for displaying an image. Each of the first pixels PX1 may include a plurality of emission areas EA1, EA2, EA3, and EA4. For example, each of the first pixels PX1 may include a first emission area EA1, a second emission area EA2, a third emission area EA3, and a fourth emission area EA4. In one or more embodiments, the first emission area EA1 may refer to an emission area of a first sub-pixel that emits a first light, and the second emission area EA2 may refer to an emission area of a second sub-pixel that emits a second light. In addition, the third emission area EA3 may refer to an emission area of a third sub-pixel that emits a third light, and the fourth emission area EA4 may refer to an emission area of a fourth sub-pixel that emits a fourth light.

The first emission area EA1, the second emission area EA2, the third emission area EA3, and the fourth emission area EA4 may emit different colors. Alternatively, any two selected from the first emission area EA1, the second emission area EA2, the third emission area EA3, and the fourth emission area EA4 may emit the same color. For example, the first emission area EA1 may emit red light, the second emission area EA2 and the fourth emission area EA4 may emit green light, and the third emission area EA3 may emit blue light.

Each of the first emission area EA1, the second emission area EA2, the third emission area EA3, and the fourth emission area EA4 has a quadrangular shape in the plan view such as a rhombus, but is not limited thereto. For example, the first emission area EA1, the second emission area EA2, the third emission area EA3, and the fourth emission area EA4 may have a polygonal, circular, or elliptical shape in the plan view other than the quadrangular shape. In addition, it has been illustrated that the third emission area EA3 has the largest size among the first emission area EA1, the second emission area EA2, the third emission area EA3, and the fourth emission area EA4, the first emission area EA1 has the second largest size, and the second emission area EA2 and the fourth emission area EA4 have the smallest size, but the disclosure is not limited thereto.

Since the driving electrodes TE, the sensing electrodes RE, and the connection electrodes BE1 are formed in the mesh structure or the net structure in the plan view, the emission areas EA1, EA2, EA3, and EA4 may not overlap the driving electrodes TE, the sensing electrodes RE, and the connection electrodes BE1 in the third direction DR3 (e.g., the Z-axis direction). Therefore, a decrease in luminance of light that is caused by the light emitted from the emission areas EA1, EA2, EA3, and EA4 being blocked by the driving electrodes TE, the sensing electrodes RE, and the connection electrodes BE1 may be prevented or reduced.

Figure 7:
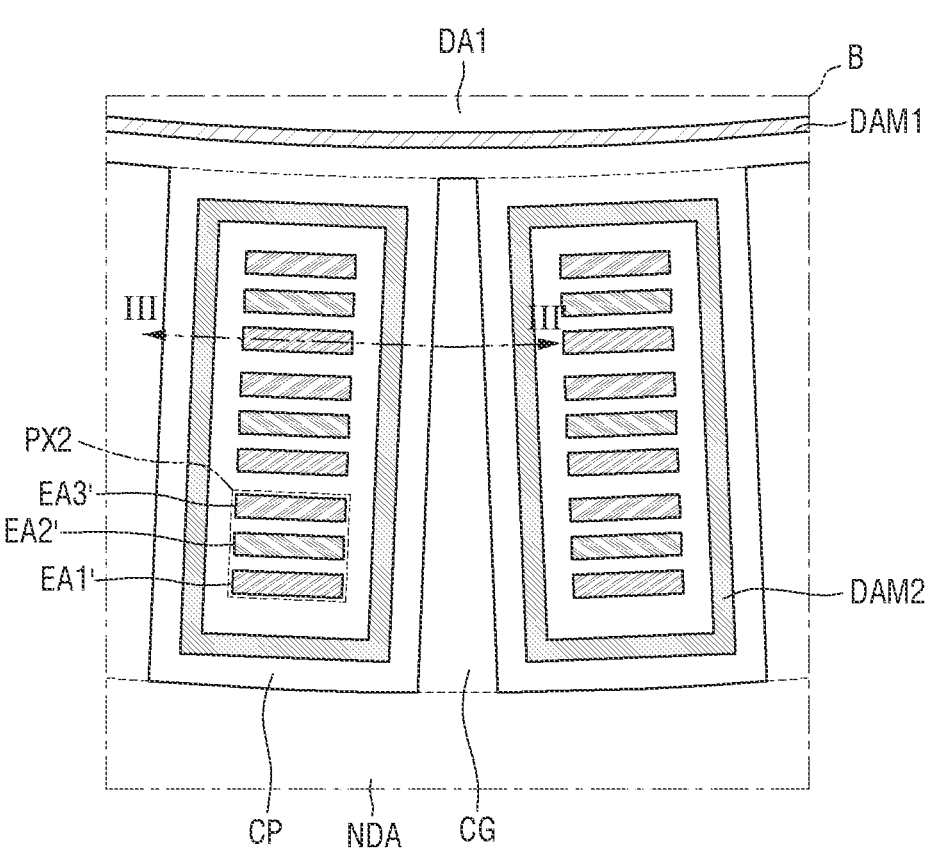
FIG. 7 is an enlarged view of area B of FIG. 4.
Figure 7:
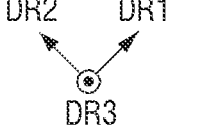

FIG. 7 is an enlarged view of area B of FIG. 4.

Referring to FIG. 7, the first display area DA1 may further include a first dam DAM1. The first dam DAM1 may be disposed along an edge of the first display area DA1. The first dam DAM1 may serve to suppress or prevent an organic material layer of the first display area DA1 from overflowing to the outside of the first display area DA1.

The second display area DA2 may further include a second dam DAM2. The second dam DAM2 may be disposed along an edge of each protrusion pattern CP of the second display area DA2. In other words, the second dam DAM2 may be disposed for each protrusion pattern CP and may surround or be around a plurality of second pixels PX2 disposed on each protrusion pattern CP.

However, the disclosure is not limited thereto, and for example, the second dam DAM2 may be partially disposed on the edge of each protrusion pattern CP, or may include spaces partially spaced apart from each other in the plan view and may be disposed in an island shape.

The second dam DAM2 may serve to suppress or prevent an organic material layer of each protrusion pattern CP of the second display area DA2 from overflowing to the outside of each protrusion pattern CP of the second display area DA2.

The protrusion patterns CP may be partitioned by the cutout portions CG. The cutout portion CG may be disposed between the protrusion patterns CP adjacent to each other. The protrusion patterns CP and the cutout portions CG may be formed by removing the display panel 300 with a laser. The cutout portion CG may be an area from which the display panel 300 is removed by the laser, and the protrusion patterns CP may be areas in which no configuration is removed by the laser. The protrusion patterns CP may be separation patterns separated with the cutout portion CG interposed therebetween.

A maximum width of the protrusion pattern CP may be wider than a maximum width of the cutout portion CG, and the cutout portion CG may be disposed in a direction substantially parallel to the protrusion pattern CP. In one or more embodiments, the protrusion patterns CP are disposed in parallel to each other with the cutout portion CG interposed therebetween, or as illustrated in FIG. 7, the protrusion patterns CP may be disposed to be inclined in the first direction DR1 and/or the second direction DR2 within about 10 degrees with the cutout portion CG interposed therebetween.

Accordingly, a width between the protrusion patterns CP of the cutout portion CG positioned between the protrusion patterns CP may decrease from the non-display area NDA to the first display area DA1. In other embodiments, the width of the cutout portion CG decreases from the non-display area NDA to the first display area DA1, and some areas of the protrusion patterns CP adjacent to each other may be in contact with each other.

Each of the second pixels PX2 may include a first emission area EA1' that emits light of a first color, a second emission area EA2' that emits light of a second color, and a third emission area EA3' that emits light of a third color.

As described above, each of the first pixels PX1 of the first display area DA1 may include the first emission area EA1, the second emission area EA2, the third emission area EA3, and the fourth emission area EA4, the first emission area EA1, the second emission area EA2, the third emission area EA3, and the fourth emission area EA4 may emit different colors, or any two thereof may emit the same color. Unlike the first display area DA1, the first emission area EA1', the second emission area EA2', and the third emission area EA3' included in the second pixels PX2 of the second display area DA2 may emit different colors. For example, the first emission area EA1' may be red, the second emission area EA2' may be green, and the third emission area EA3' may be blue.

In addition, each of the first emission area EA1, the second emission area EA2, the third emission area EA3, and the fourth emission area EA4 of the first display area DA1 may have a quadrangular shape in the plan view like a rhombus and may be arranged in an RGBG (e.g., a PEN-TILE®) manner (PENTILE® is a registered trademark of Samsung Display Co., Ltd., Republic of Korea), but unlike the first display area DA1, the first emission area EA1', the second emission area EA2', and the third emission area EA3' included in the second pixels PX2 of the second display area DA2 may be arranged in a line in a direction from the first display area DA1 to the non-display area NDA.

Each of the first emission area EA1', the second emission area EA2', and the third emission area EA3' included in the second pixels PX2 may have a rectangular shape in the plan view. For example, each of the first emission area EA1', the second emission area EA2', and the third emission area EA3' may have a rectangular shape having an aspect ratio of about 1:3 in the plan view. However, the disclosure is not limited thereto, and each of the first emission area EA1', the second emission area EA2', and the third emission area EA3' may have a polygonal, circular, or elliptical shape in the plan view other than the quadrangular shape and may be arranged in a PENTILE® manner like the first display area DA1.

In addition, it is illustrated in FIG. 7 that the first to third emission areas EA1' EA2', and EA3' have substantially the same area, but the disclosure is not limited thereto. The first to third emission areas EA1', EA2', and EA3' may have different areas.

Hereinafter, a cross section of the display panel 300 will be described.

Figure 8:
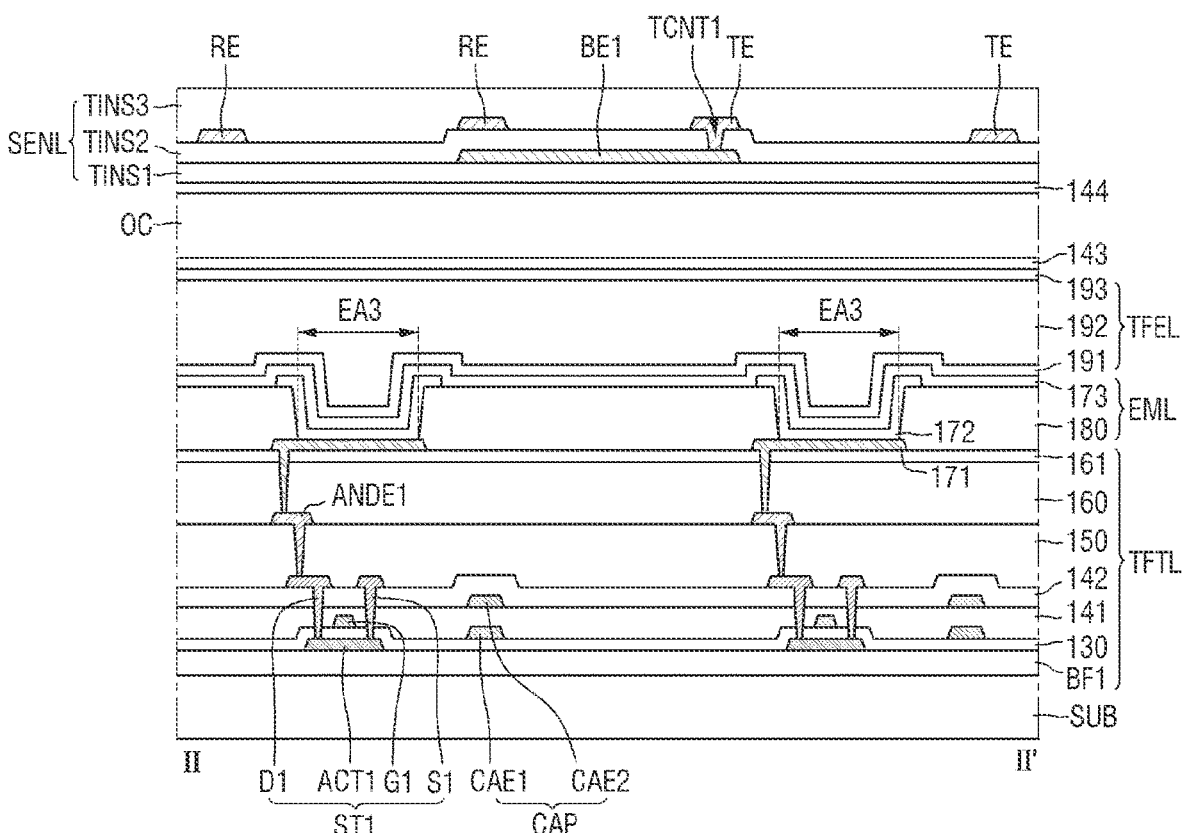
FIG. 8 is a cross-sectional view illustrating an example of a portion of the display panel taken along line II-II' of FIG. 6 according to one or more embodiments.

FIG. 8 is a cross-sectional view illustrating an example of the display panel taken along line II-II' of FIG. 6.

Referring to FIG. 8, a display layer DISL including a thin film transistor layer TFTL, a light emitting element layer EML, and an encapsulation layer TFEL may be disposed on the substrate SUB, and a sensor electrode layer SENL including driving electrodes TE, sensing electrodes RE, and connection electrodes BE1 may be disposed on the display layer DISL.

The substrate SUB may include the flexible substrate that may be bent, folded, rolled, and/or stretched.

The thin film transistor layer TFTL including first thin film transistors ST1 may be disposed on the substrate SUB. The thin film transistor layer TFTL may include a first thin film transistor ST1, a first connection electrode ANDE1, a first buffer layer BF1, a gate insulating layer 130, a first interlayer insulating layer 141, a second interlayer insulating layer 142, a first planarization layer 150, a second planarization layer 160, and a barrier layer 161.

In one or more embodiments, the first buffer layer BF1 may be disposed on the substrate SUB. The first buffer layer BF1 may be formed of a silicon nitride layer, a silicon oxynitride layer, a silicon oxide layer, a titanium oxide layer, and/or an aluminum oxide layer.

The first thin film transistor ST1 may be disposed on the first buffer layer BF1. The first thin film transistor ST1 may include a first active layer ACT1, a first gate electrode G1, a first source electrode S1, and a first drain electrode D1.

The first active layer ACT1 of the first thin film transistor ST1 may be disposed on the first buffer layer BF1. The first active layer ACT1 may include a silicon semiconductor such as polycrystalline silicon, single crystal silicon, low-temperature polycrystalline silicon, and/or amorphous silicon. The first active layer ACT1 overlapping the first gate electrode G1 in the thickness direction may be defined as a channel area. The first active layer ACT1 that does not overlap the first gate electrode G1 in the thickness direction may be defined as a conductive area. The conductive area of the first active layer ACT1 may have conductivity by doping a silicon semiconductor with ions and/or impurities.

The gate insulating layer 130 may be disposed on the first active layer ACT1 of the first thin film transistor ST1. The gate insulating layer 130 may be formed of an inorganic layer, for example, a silicon nitride layer, a silicon oxynitride layer, a silicon oxide layer, a titanium oxide layer, and/or an aluminum oxide layer.

The first gate electrode G1 of the first thin film transistor ST1 and a first capacitor electrode CAE1 may be disposed on the gate insulating layer 130. The first gate electrode G1 of the first thin film transistor ST1 may overlap the first active layer ACT1 in the third direction DR3. The first capacitor electrode CAE1 may overlap a second capacitor electrode CAE2 in the third direction DR3. The first gate electrode G1 and the first capacitor electrode CAE1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The first interlayer insulating layer 141 may be disposed on the first gate electrode G1 and the first capacitor electrode CAE1. The first interlayer insulating layer 141 may be formed of an inorganic layer, for example, a silicon nitride layer, a silicon oxynitride layer, a silicon oxide layer, a titanium oxide layer, and/or an aluminum oxide layer. The first interlayer insulating layer 141 may include a plurality of inorganic layers.

The second capacitor electrode CAE2 may be disposed on the first interlayer insulating layer 141. The second capacitor electrode CAE2 may overlap the first capacitor electrode CAE1 in the third direction DR3. Since the first interlayer insulating layer 141 has a suitable dielectric constant (e.g., a predetermined dielectric constant), a capacitor CAP may be formed by the first capacitor electrode CAE1, the second capacitor electrode CAE2, and the first interlayer insulating layer 141. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, and/or an aluminum oxide layer.

The first source electrode S1 and the first drain electrode D1 of the first thin film transistor ST1 may be disposed on the second interlayer insulating layer 142. The first source electrode S1 and the first drain electrode D1 may be formed as a single layer or multiple layers made of any one of aluminum (Al), chromium (Cr), gold (Au), titanium (Ti), nickel (Ni), neodymium (Nd), molybdenum (Mo), and copper (Cu), or alloys thereof.

The first source electrode S1 of the first thin film transistor ST1 may be connected to the conductive area disposed on one side of the channel area of the first active layer ACT1 through a contact hole penetrating through the gate insulating layer 130, the first interlayer insulating layer 141, and the second interlayer insulating layer 142. The first drain electrode D1 of the first thin film transistor ST1 may be connected to the conductive area disposed on the other side of the channel area of the first active layer ACT1 through the contact hole penetrating through the gate insulating layer 130, the first interlayer insulating layer 141, and the second interlayer insulating layer 142.

The first planarization layer 150 may be disposed on the first source electrode S1 and the first drain electrode D1 to planarize a step caused by the thin film transistors. The first planarization layer 150 may be formed of an organic layer made of an acryl resin, an epoxy resin, a phenolic resin, a polyamide resin, a polyimide resin, and/or one or more other suitable materials.

The first connection electrode ANDE1 may be disposed on the first planarization layer 150. The first connection electrode ANDE1 may be connected to the first source electrode S1 or the first drain electrode D1 of the first thin film transistor ST1 through a contact hole penetrating through the first planarization layer 150. The first connection electrode ANDE1 may be formed as a single layer or multiple layers made of any one of aluminum (Al), chromium (Cr), gold (Au), titanium (Ti), nickel (Ni), neodymium (Nd), molybdenum (Mo), and copper (Cu), or alloys thereof.

The second planarization layer 160 may be disposed on the first connection electrode ANDE1. The second planarization layer 160 may be formed of an organic layer made of an acryl resin, an epoxy resin, a phenolic resin, a polyamide resin, a polyimide resin, and/or one or more other suitable materials.

The barrier layer 161 may be disposed on the second planarization layer 160. The barrier layer 161 may be formed of a silicon nitride layer, a silicon oxynitride layer, a silicon oxide layer, a titanium oxide layer, and/or an aluminum oxide layer.

The light emitting element layer EML is disposed on the thin film transistor layer TFTL. The light emitting element layer EML may include first light emitting elements 170 and a bank 180.

Each of the first light emitting elements 170 may include a first pixel electrode 171, a first light emitting layer 172, and a first common electrode 173. Each of the emission areas EA1, EA2, EA3, and EA4 refers to an area in which the first pixel electrode 171, the first light emitting layer 172, and the first common electrode 173 are sequentially stacked and holes from the first pixel electrode 171 and electrons from the first common electrode 173 are coupled with each other in the first light emitting layer 172 to emit light. In one or more embodiments, the first pixel electrode 171 may be an anode electrode, and the first common electrode 173 may be a cathode electrode.

The first pixel electrode 171 may be disposed on the barrier layer 161. The first pixel electrode 171 may be connected to the first connection electrode ANDE1 through a contact hole penetrating through the barrier layer 161 and the second planarization layer 160.

In a top emission structure that emits light in a direction of the first common electrode 173 with respect to the first light emitting layer 172, the first pixel electrode 171 may have a stacked layer structure in which a material layer having a high work function, made of indium-tin-oxide (ITO), indium-zinc-oxide (IZO), zinc oxide (ZnO), and/or indium oxide ($In_2O_3$) and a reflective material layer made of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof are stacked. The first pixel electrode 171 may have a multilayer structure of ITO/Mg, ITO/$MgF_2$, ITO/Ag, and/or ITO/Ag/ITO, but is not limited thereto.

The bank 180 serves to define the emission areas EA1, EA2, EA3, and EA4 of the first pixels PX1. To this end, the bank 180 may be formed to expose a partial area of the first pixel electrode 171 on the barrier layer 161. The bank 180 may cover an edge of the first pixel electrode 171.

The bank 180 may be formed of an organic layer such as an acrylic resin, an epoxy resin, a phenolic resin, a polyamide resin, and/or a polyimide resin.

The first light emitting layer 172 is disposed on the first pixel electrode 171. The first light emitting layer 172 may include an organic material to emit light of a suitable color (e.g., a predetermined color). For example, the first light emitting layer 172 may include a hole transporting layer, an organic material layer, and/or an electron transporting layer.

The encapsulation layer TFEL may be formed on the light emitting element layer EML. The encapsulation layer TFEL may include at least one inorganic layer in order to prevent (or substantially prevent) oxygen or moisture from penetrating into the light emitting element layer EML. In addition, the encapsulation layer TFEL may include at least one organic layer in order to protect the light emitting element layer EML from particles.

For example, the encapsulation layer TFEL may include a first encapsulation inorganic layer 191 disposed on the first common electrode 173, an encapsulation organic layer 192 disposed on the first encapsulation inorganic layer 191, and a second encapsulation inorganic layer 193 disposed on the encapsulation organic layer 192. The first encapsulation inorganic layer 191 and the second encapsulation inorganic layer 193 may be formed as multiple layers in which one or more inorganic layers of a silicon nitride layer, a silicon oxynitride layer, a silicon oxide layer, a titanium oxide layer, and/or an aluminum oxide layer are alternately stacked. The encapsulation organic layer 192 may be made of an acrylic resin, an epoxy resin, a phenolic resin, a polyamide resin, and/or a polyimide resin.

A third interlayer insulating layer 143, a third planarization layer OC, and a fourth interlayer insulating layer 144 may be sequentially disposed on the encapsulation layer TFEL. The third interlayer insulating layer 143 and the fourth interlayer insulating layer 144 may include the same material as the first interlayer insulating layer 141 and the second interlayer insulating layer 142, and may be formed as multiple layers in which one or more inorganic layers are alternately stacked. However, the disclosure is not limited thereto.

The third interlayer insulating layer 143 and the fourth interlayer insulating layer 144 may be in contact with each other at the ends thereof, and as a result, the third planarization layer OC may be protected by the third interlayer insulating layer 143 and the fourth interlayer insulating layer 144.

The third planarization layer OC may be disposed on the third interlayer insulating layer 143. The third planarization layer OC may be formed as an organic layer made of an acryl resin, an epoxy resin, a phenolic resin, a polyamide resin, a polyimide resin, and/or one or more other suitable materials.

The sensor electrode layer SENL may be disposed on the fourth interlayer insulating layer 144. The sensor electrode layer SENL may include the driving electrodes TE, the sensing electrodes RE, and the connection electrodes BE1.

A first touch inorganic layer TINS1 may be disposed on the fourth interlayer insulating layer 144. The first touch inorganic layer TINS1 may be formed of a silicon nitride layer, a silicon oxynitride layer, a silicon oxide layer, a titanium oxide layer, and/or an aluminum oxide layer.

The connection electrodes BE1 may be disposed on the first touch inorganic layer TINS1. The connection electrodes BE1 may have a stacked layer structure in which a material layer having a high work function, made of indium tin oxide (ITO), indium zinc oxide (IZO), zinc oxide (ZnO), and/or indium oxide ($In_2O_3$) and a reflective material layer made of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof are stacked. The connection electrodes BE1 may have a multilayer structure of ITO/Mg, ITO/$MgF_2$, ITO/Ag, and/or ITO/Ag/ITO, but is not limited thereto.

A second touch inorganic layer TINS2 may be disposed on the connection electrodes BE1.

The second touch inorganic layer TINS2 may be formed of a silicon nitride layer, a silicon oxynitride layer, a silicon oxide layer, a titanium oxide layer, and/or an aluminum oxide layer.

The driving electrodes TE and the sensing electrodes RE may be disposed on the second touch inorganic layer TINS2. In order to prevent or reduce a decrease in luminance of light that is caused by the light emitted from the emission area EA3 being blocked by the driving electrodes TE and the sensing electrodes RE, the driving electrodes TE and the sensing electrodes RE do not overlap the emission area EA3. The driving electrodes TE and the sensing electrodes RE may include the same material and structure as the connection electrodes BE1.

A touch organic layer TINS3 may be disposed on the driving electrodes TE and the sensing electrodes RE. The touch organic layer TINS3 may be made of an acrylic resin, an epoxy resin, a phenolic resin, a polyamide resin, and/or a polyimide resin.

Figure 9:
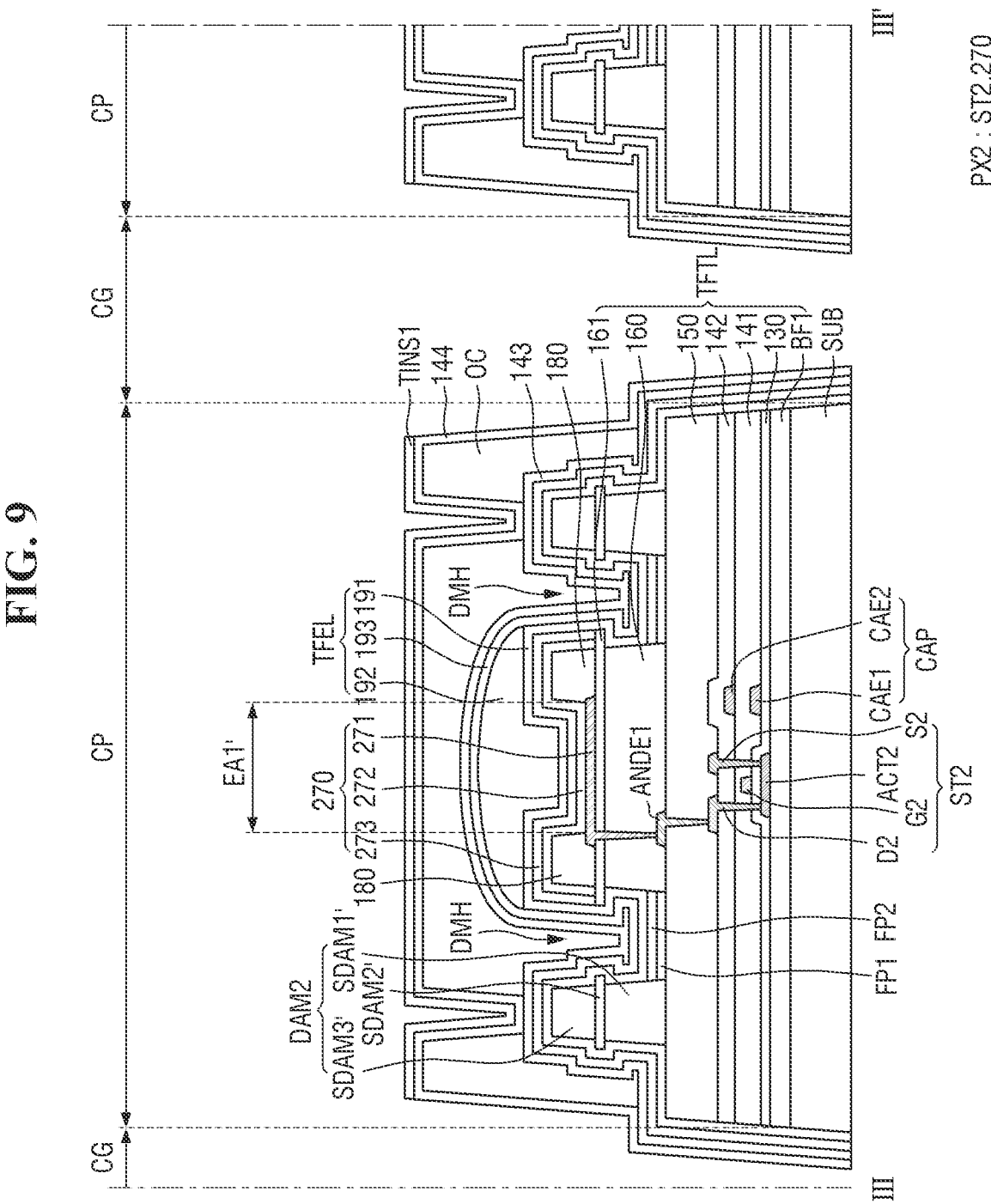
FIG. 9 is a cross-sectional view illustrating an example of a portion of the display panel taken along line III-III' of FIG. 7 according to one or more embodiments.

FIG. 9 is a cross-sectional view illustrating an example of the display panel taken along line III-III' of FIG. 7. FIG. 9 illustrates a cross-sectional view of the protrusion patterns CP and the cutout portions CG of FIG. 7.

Referring to FIG. 9, a second thin film transistor ST2 of a thin film transistor layer TFTL, a second pixel electrode 271, a second light emitting layer 272, and a second common electrode 273 of a second light emitting element 270 may be substantially the same as the first thin film transistor ST1 of the thin film transistor layer TFTL, the first pixel electrode 171, the first light emitting layer 172, and the first common electrode 173 of the first light emitting element 170 described with reference to FIG. 8, that is, a second active layer ACT2, a second gate electrode G2, a second source electrode S2 and a second drain electrode D2 of the second thin film transistor ST2 may be substantially the same as the first active layer ACT1, the first gate electrode G1, the first source electrode S1 and the first drain electrode D1 of the first thin film transistor ST1 described with reference to FIG. 8.

FIG. 9 illustrates a first emission area EA1', and the second emission area EA2' and the third emission area EA3' are substantially the same as the first emission area EA1' illustrated in FIG. 9.

In each of the cutout portions CG, the thin film transistor layer TFTL and the substrate SUB may be removed by a laser. For example, the substrate SUB, the buffer layer BF1, the gate insulating layer 130, the first interlayer insulating layer 141, the second interlayer insulating layer 142, the first planarization layer 150, the second planarization layer 160, and the barrier layer 161 may not be disposed in each of the cutout portions CG.

In addition, the third interlayer insulating layer 143, the fourth interlayer insulating layer 144, and the third planarization layer OC may not be disposed in each of the cutout portions CG.

The protrusion pattern CP may include a top surface and a cut surface or a side surface formed by cutting the cutout portion CG, and the thin film transistor layer TFTL, the light emitting element layer EML, the encapsulation layer TFEL, the third planarization layer OC, the third interlayer insulating layer 143, the fourth interlayer insulating layer 144, and the first touch inorganic layer TINS1 may be disposed on each of the top surfaces of the protrusion patterns CP.

In addition, the first encapsulation inorganic layer 191 and the second encapsulation inorganic layer 193 included in the encapsulation layer TFEL, the third interlayer insulating layer 143, and the fourth interlayer insulating layer 144 may be disposed on an entire surface of the protrusion pattern CP including the top surface and side surfaces of the protrusion pattern CP.

The encapsulation organic layer 192 of the encapsulation layer TFEL may be disposed on the bank 180, and both ends of the encapsulation organic layer 192 may coincide with the ends of the top surface of the first encapsulation inorganic layer 191 disposed on the bank 180. In addition, the encapsulation organic layer 192 may have the highest height in the thickness direction with respect to the top surface of the first encapsulation inorganic layer 191 at a central portion thereof and have a lower height toward both side surfaces, and the encapsulation organic layer 192 may be encapsulated by the first encapsulation inorganic layer 191 and the second encapsulation inorganic layer 193.

However, the disclosure is not limited, and in order for the encapsulation organic layer 192 to be stably disposed in the second dam DAM2 on the protrusion pattern CP, both ends of the encapsulation organic layer 192 may be positioned on a top surface of the second dam DAM2.

The third planarization layer OC may cover the encapsulation layer TFEL and an area between the cutout portion CG and the second dam DAM2, and may be disposed on the second dam DAM2.

In one or more embodiments, the third planarization layer OC may include a top surface, an opposite surface connected to the top surface, and an outer side surface, and the opposite surface may be disposed on the top surface of the second dam DAM2 and may expose at least a portion of the third interlayer insulating layer 143 disposed on the top surface of the second dam DAM2. In addition, the outer side surface of the third planarization layer OC may be disposed on an outer side surface of the second dam DAM2 and may expose at least a portion of the area between the cutout portion CG and the second dam DAM2.

Since the third planarization layer OC is formed by a photolithography process, the third planarization layer OC may be made of a material different from that of the encapsulation organic layer 192, and may include the same material as the above-described first planarization layer 150 and the second planarization layer 160.

Since the third interlayer insulating layer 143 and the fourth interlayer insulating layer 144 are disposed on the second dam DAM2, the third interlayer insulating layer 143 and the fourth interlayer insulating layer 144 may be in contact with each other on the second dam DAM2.

In one or more embodiments, the third interlayer insulating layer 143 disposed on the second dam DAM2 exposed by the third planarization layer OC and the fourth interlayer insulating layer 144 disposed on the third planarization layer OC may be in contact with each other. In addition, the third interlayer insulating layer 143 and the fourth interlayer insulating layer 144 may be sequentially disposed on the side surface of the protrusion pattern CP to be in contact with each other.

Therefore, the third planarization layer OC may be protected by the third interlayer insulating layer 143 and the fourth interlayer insulating layer 144, and since the third planarization layer OC has a higher height than the third interlayer insulating layer 143 and the fourth interlayer insulating layer 144, the third planarization layer OC may planarize the protrusion pattern CP and also serve as a particle cover layer for covering the particles.

The first touch inorganic layer TINS1 may be disposed on the third planarization layer OC. In one or more embodiments, the first touch inorganic layer TINS1 is not disposed on the side surface of the protrusion pattern CP, but is disposed only on the top surface of the third planarization layer OC, unlike the third interlayer insulating layer 143 and the fourth interlayer insulating layer 144 disposed on the entire surface of the protrusion pattern CP.

In addition, as illustrated in FIG. 9, an end of the first touch inorganic layer TINS1 disposed on the fourth interlayer insulating layer 144 may coincide with an end of a top surface of the fourth interlayer insulating layer 144. However, the disclosure is not limited thereto, and the end of the first touch inorganic layer TINS1 disposed on the fourth interlayer insulating layer 144 may be disposed so as not to protrude from or coincide with the end of the top surface of the fourth interlayer insulating layer 144.

Therefore, the fourth interlayer insulating layer 144 may be disposed on the outer side surface of the third planarization layer OC, and the first touch inorganic layer TINS1 may cover the top surface of the fourth interlayer insulating layer 144 disposed on the top surface of the third planarization layer OC, and may expose an outer side surface of the fourth interlayer insulating layer 144 disposed on the outer side surface of the third planarization layer OC.

In addition, the first encapsulation inorganic layer 191, the second encapsulation inorganic layer 193, the third interlayer insulating layer 143, and the fourth interlayer insulating layer 144 may be sequentially stacked on the cut surface or the side surface of the protrusion pattern CP. However, the disclosure is not limited thereto.

In other embodiments, in order to compensate for the step formed by the cutout portion CG of the second display area DA2, the third planarization layer OC and a sacrificial layer DOC (see, e.g., FIG. 23) may be formed in the protrusion pattern CP and the cutout portion CG, respectively, and the sensor electrode layer SENL including the driving electrodes TE, the sensing electrodes RE, and the connection electrodes BE1 may be disposed on the protrusion pattern CP.

A more detailed description of a method of forming the third planarization layer OC and the sacrificial layer DOC in the protrusion pattern CP and the cutout portion CG, respectively, to compensate for the step formed by the cutout portion CG will be described later.

The second dam DAM2 may include a first sub-dam SDAM1' formed of the same material as the second planarization layer 160, a second sub-dam SDAM2' formed of the same material as the barrier layer 161, and a third sub-dam SDAM3' formed of the same material as the bank 180. The second dam DAM2 may further include a fourth sub-dam disposed on the third sub-dam SDAM3'.

A dam hole DMH may be disposed inside the second dam DAM2. When the second light emitting layer 272 is formed using the same mask as the second common electrode 273 in the second display area DA2, a structure for disconnecting the second light emitting layer 272, such as the dam hole DMH, is required.

The dam hole DMH may have an undercut shape. The undercut-shaped hole refers to a hole in which a size of an entrance thereof is smaller than a size of a bottom thereof, or a hole in which the size of the entrance thereof is smaller than a size of an area between the entrance and the bottom. The undercut-shaped hole may be similar to a shape of a pot or a shape of eaves of a roof. For example, the entrance of the dam hole DMH may be defined by the barrier layer 161. A bottom surface of the barrier layer 161 may not be covered by the second planarization layer 160. For this reason, the size of the entrance of the dam hole DMH may be smaller than the size of the area between the entrance and the bottom of the dam hole DMH.

A first floating pattern FP1, a second floating pattern FP2, and the first encapsulation inorganic layer 191 may be disposed in the dam hole DMH, and the third planarization layer OC may be filled in the dam hole DMH.

When the dam hole DMH has the undercut shape, the second light emitting layer 272 and the second common electrode 273 may not be disposed on a sidewall of the dam hole DMH. Accordingly, the second light emitting layer 272 and the second common electrode 273 may be disconnected from the dam hole DMH.

The first floating pattern FP1 may be disposed on the first planarization layer 150 in the dam hole DMH. The first floating pattern FP1 may be a residual layer of the second light emitting layer 272 that is not connected to the second light emitting layer 272 and is disconnected. The first floating pattern FP1 may be made of the same material as the second light emitting layer 272. When a size of the dam hole DMH is small, the first floating pattern FP1 may not exist.

In addition, the second floating pattern FP2 may be disposed on the first floating pattern FP1 of the dam hole DMH. The second floating pattern FP2 may be a residual layer of the second common electrode 273 that is not connected to the second common electrode 273 and is disconnected. The second floating pattern FP2 may be made of the same material as the second common electrode 273. When the size of the dam hole DMH is small, the second floating pattern FP2 may not exist.

Hereinafter, other embodiments will be described. In the following embodiments, a description for the same configurations as those of the embodiment described above will be omitted or simplified and configurations different from those of the embodiment described above will be mainly described.

Figure 10:
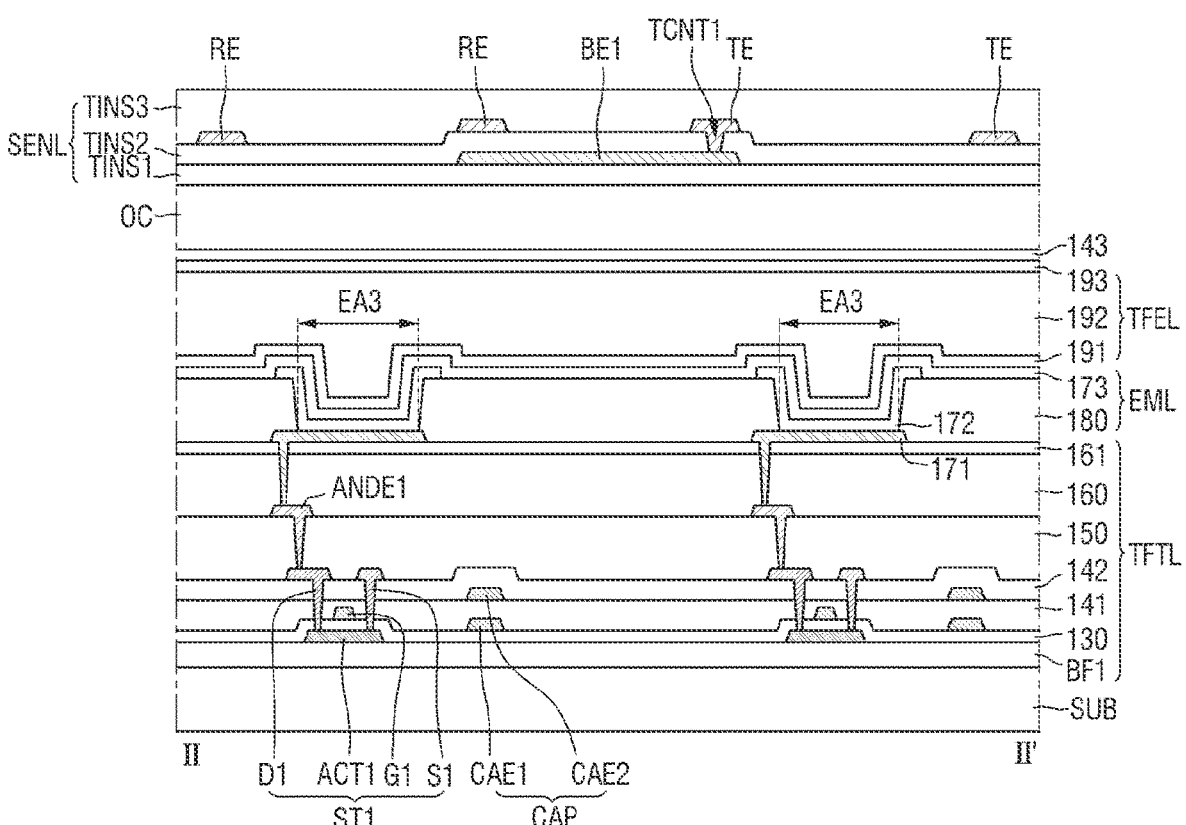
FIG. 10 is a cross-sectional view illustrating an example of a portion of the display panel taken along line II-II' of FIG. 6 according to one or more embodiments.

FIG. 10 is a cross-sectional view illustrating an example of the display panel taken along line II-II' of FIG. 6 according to one or more embodiments.

Referring to FIG. 10, the display panel is different from the display panel according to the embodiment of FIG. 8 in that the third interlayer insulating layer 143, the third planarization layer OC, and the sensor electrode layer SENL are sequentially disposed on the encapsulation layer TFEL, and the fourth interlayer insulating layer 144 is omitted.

Therefore, the first touch inorganic layer TINS1, the connection electrode BE1, the second touch inorganic layer TINS2, the driving electrodes TE, the sensing electrode RE, and the touch organic layer TINS3 may be sequentially disposed on the third interlayer insulating layer 143, and the sensor electrode layer SENL may be formed on the third interlayer insulating layer 143.

Figure 11:
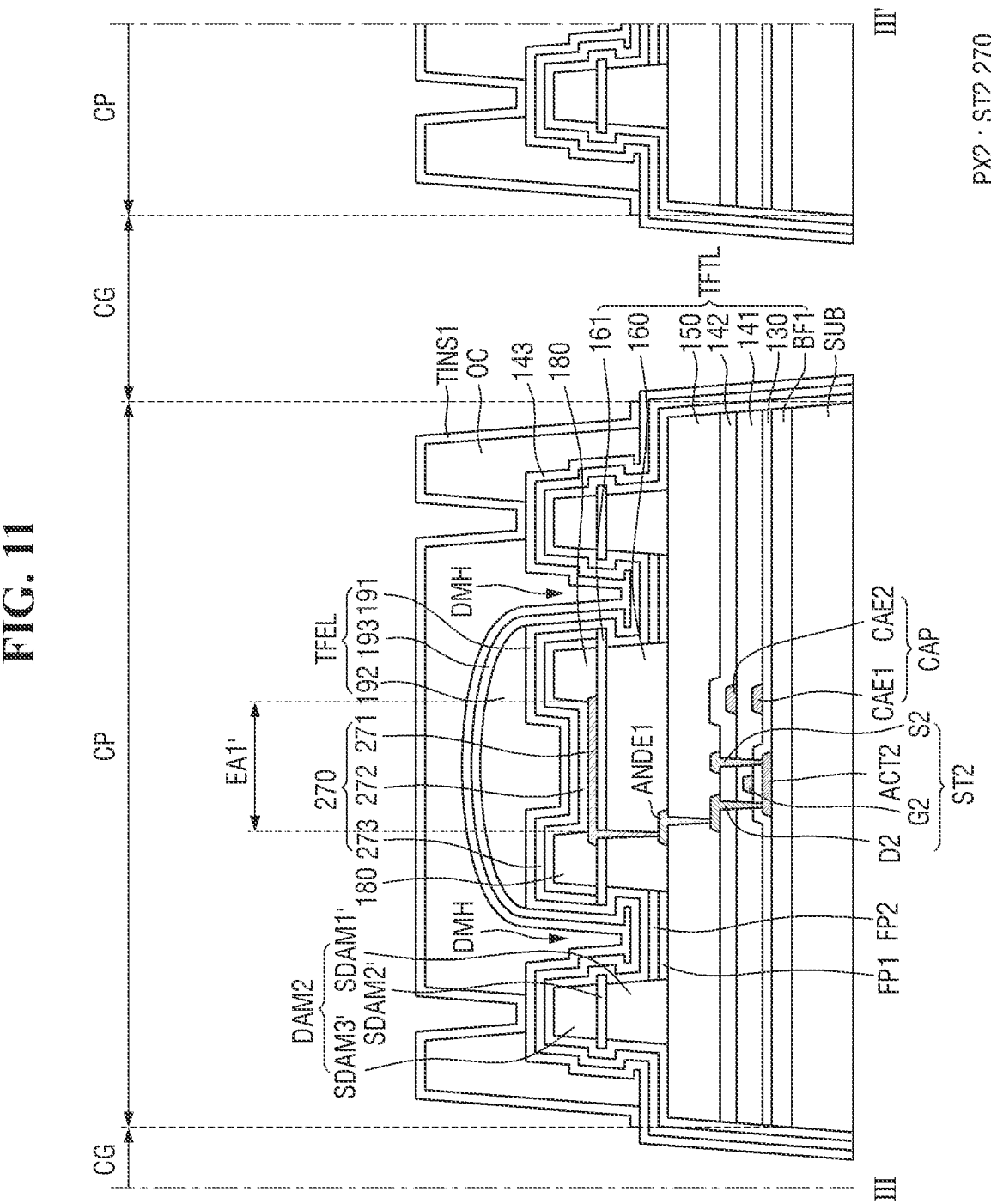
FIG. 11 is a cross-sectional view illustrating an example of a portion of the display panel taken along line III-III' of FIG. 7 according to one or more embodiments.

FIG. 11 is a cross-sectional view illustrating an example of the display panel taken along line III-III' of FIG. 7 according to one or more embodiments.

Referring to FIG. 11, the embodiment is different from the embodiment of FIG. 9 in that the fourth interlayer insulating layer 144 is omitted on the third planarization layer OC, the first touch inorganic layer TINS1 is directly disposed on the third planarization layer OC, and the first touch inorganic layer TINS1 covers the side surface of the third planarization layer OC.

For example, the embodiment of FIG. 11 may be different from the embodiment of FIG. 9 in that the fourth interlayer insulating layer 144 is omitted, and the first touch inorganic layer TINS1 is directly disposed on the top surface and the side surface of the third planarization layer OC, and exposes the third interlayer insulating layer 143 disposed on the side surfaces of the substrate SUB, the first buffer layer BF1, the gate insulating layer 130, the first interlayer insulating layer 141, the second interlayer insulating layer 142, and the first planarization layer 150, unlike the embodiment of FIG. 9 in which the first touch inorganic layer TINS1 is disposed only on the top surface of the third planarization layer OC, and exposes the fourth interlayer insulating layer 144 covering the side surface of the third planarization layer OC and the side surfaces of the substrate SUB, the first buffer layer BF1, the gate insulating layer 130, the first interlayer insulating layer 141, the second interlayer insulating layer 142, and the first planarization layer 150.

Hereinafter, a method of manufacturing a display device according to one or more embodiments will be described in detail.

Figure 12:
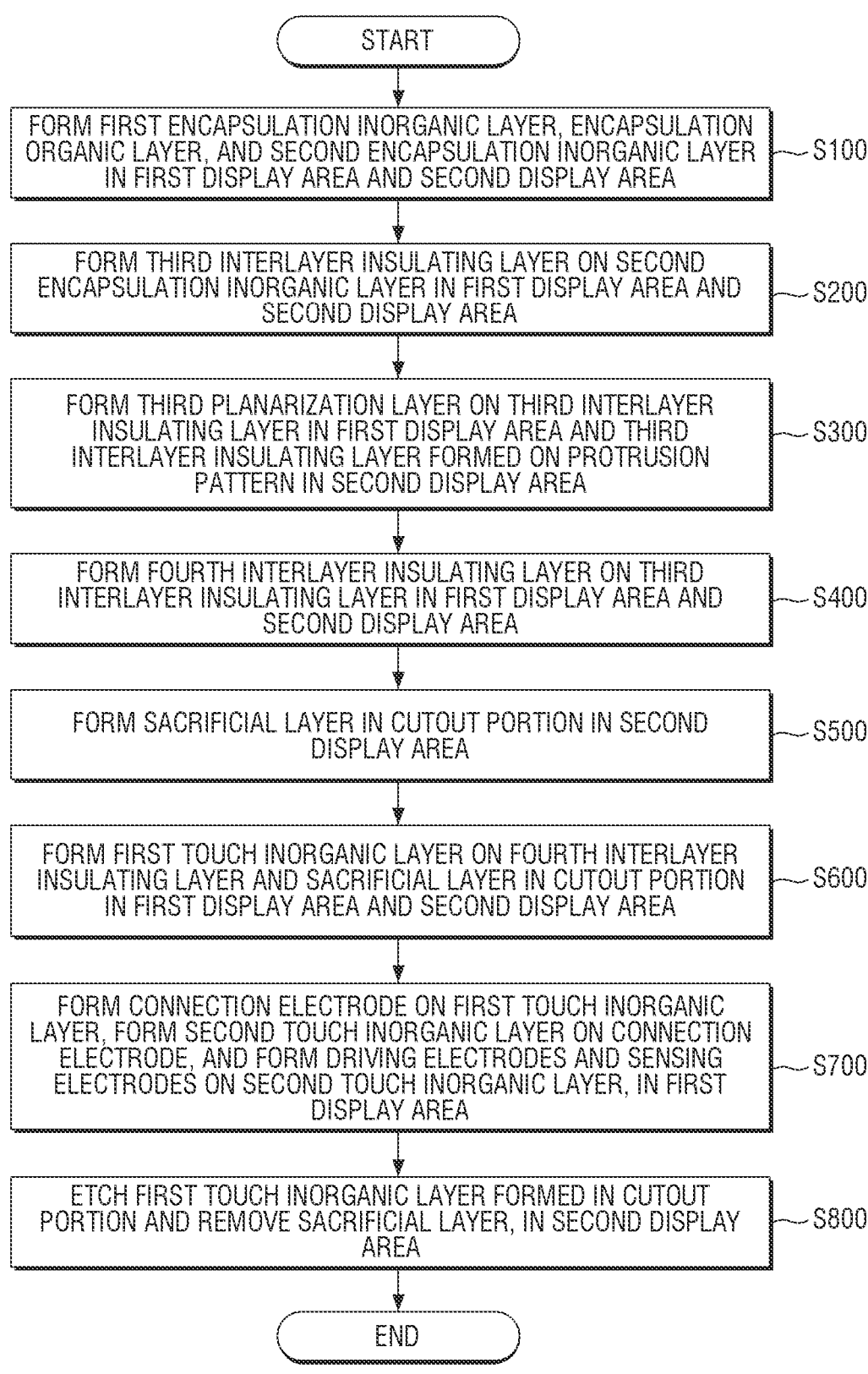
FIG. 12 is a flowchart illustrating a method of manufacturing the display device according to one or more embodiments.

FIG. 12 is a flowchart illustrating a method of manufacturing a display device according to one or more embodiments. FIGS. 13 to 27 are cross-sectional views for describing the method of manufacturing a display device according to one or more embodiments.

FIGS. 13, 15, 17, 19, 21, and 24 are cross-sectional views illustrating an example of the display panel taken along line II-II' of FIG. 6, and FIGS. 14, 16, 18, 20, 22, 23, and 25 to 27 are cross-sectional views illustrating an example of the display panel taken along line III-III' of FIG. 7.

FIGS. 13, 15, 17, 19, 21, and 24 illustrate a first display area DA1 of the display panel 300, and FIGS. 14, 16, 18, 20, 22, 23, and 25 to 27 illustrate a second display area DA2 of the display panel 300.

Figure 13:
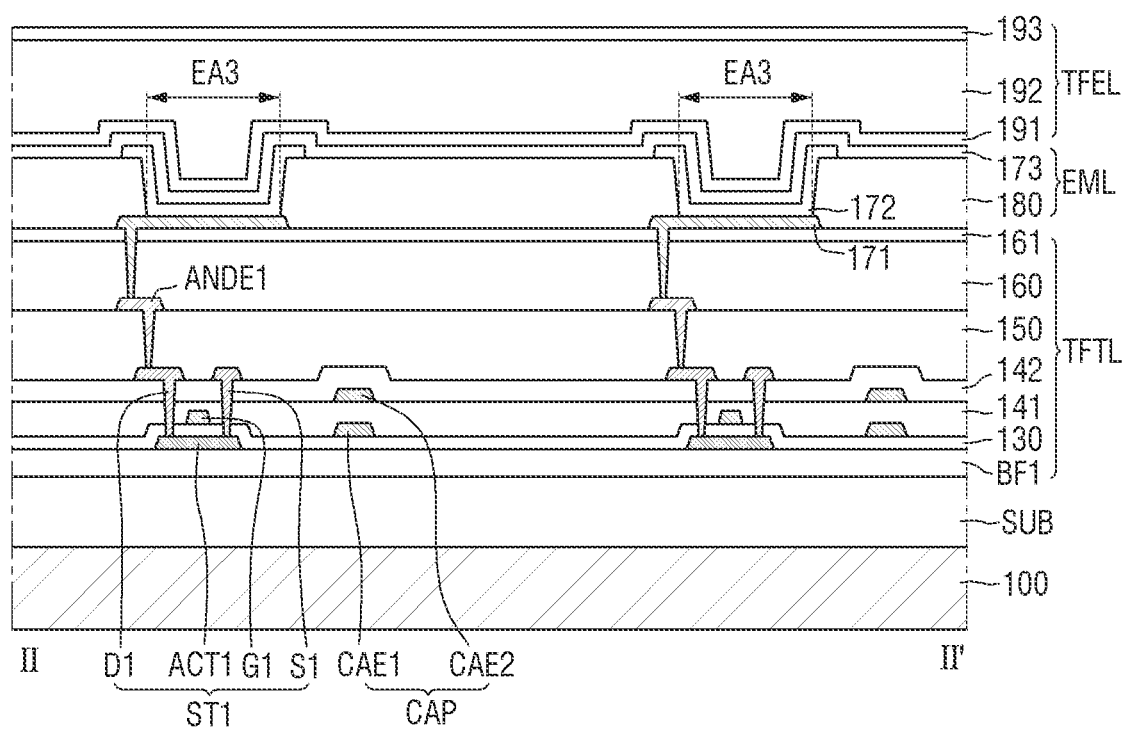
FIGS. 13 to 27 are cross-sectional views for describing the method of manufacturing the display device according to the embodiment of FIG. 12.
Figure 14:
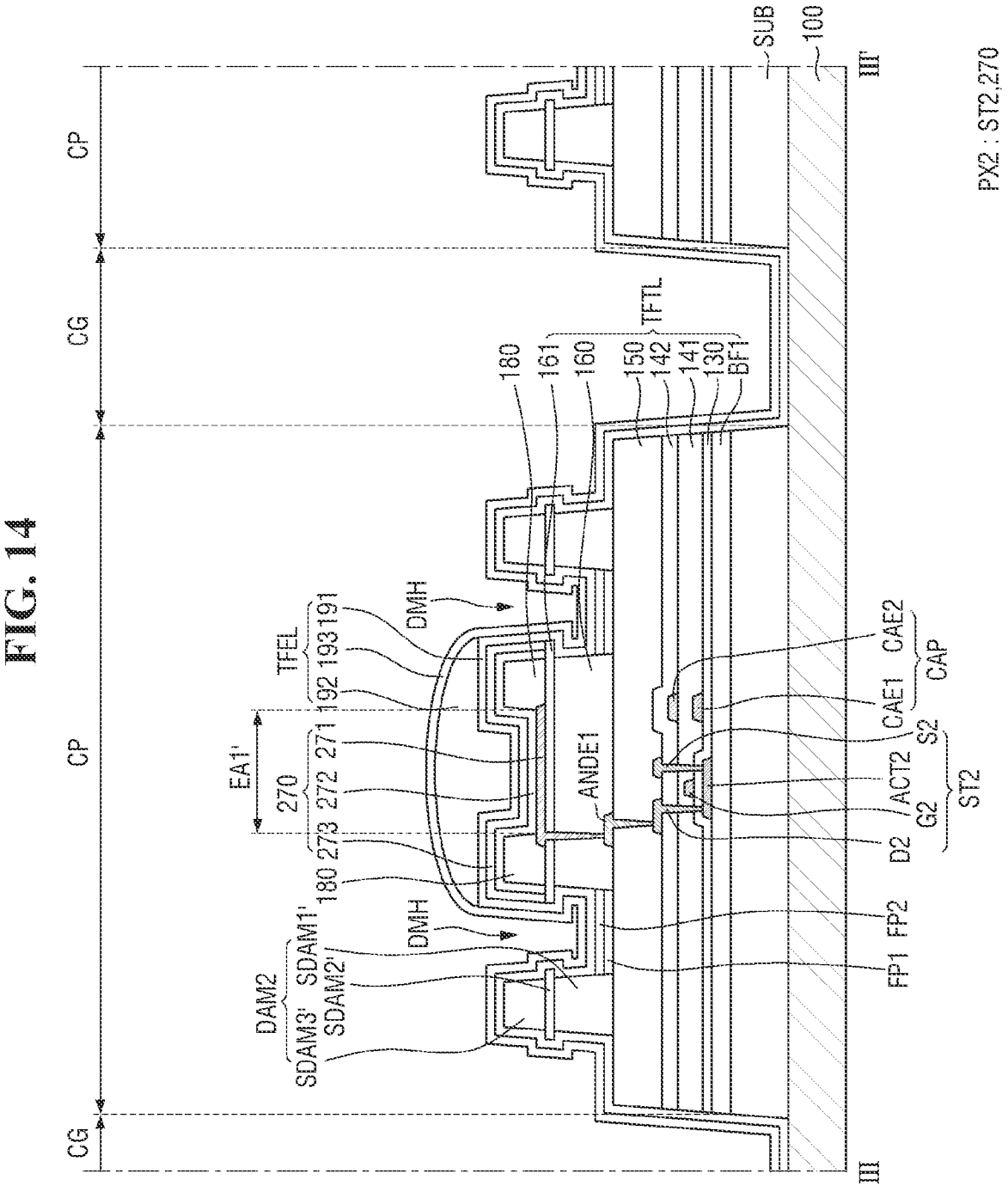

First, as illustrated in FIGS. 13 and 14, an encapsulation layer (see, e.g., 'TFEL' in FIG. 8) is formed on a first light emitting element 170 of the first display area DA1 and a second light emitting element 270 of the second display area DA2 (see, e.g., 'S100' in FIG. 12).

Referring to FIGS. 13 and 14, a thin film transistor layer TFTL and a light emitting element layer EML are formed on a substrate SUB by one or more various methods known to those skilled in the art.

Since a process of disposing a first encapsulation inorganic layer 191, a second encapsulation inorganic layer 193, a third interlayer insulating layer 143, a fourth interlayer insulating layer 144, and a sacrificial layer DOC (see, e.g., FIG. 23) in a protrusion pattern CP and a cutout portion CG of the second display area DA2 is performed after the substrate SUB and the thin film transistor layer TFTL of the second display area DA2 are removed by a laser, a sub-substrate 100 may be disposed on a lower side of the substrate SUB in order to manufacture the display panel (or a target panel) 300. The sub-substrate 100 may include a rigid material such as glass.

Referring to FIGS. 13 and 14, the first encapsulation inorganic layer 191 may be disposed on a first common electrode 173 of the first display area DA1 and a second common electrode 273 of the second display area DA2.

In addition, the first encapsulation inorganic layer 191 may be disposed on a second dam DAM2 disposed on a top surface of the protrusion pattern CP and a cut surface or a side surface of the protrusion pattern CP in the second display area DA2. That is, the first encapsulation inorganic layer 191 may be disposed on side surfaces of the substrate SUB, a first buffer layer BF1, a gate insulating layer 130, a first interlayer insulating layer 141, a second interlayer insulating layer 142, and a first planarization layer 150. In addition, the first encapsulation inorganic layer 191 may be disposed on a top surface of the sub-substrate 100 disposed in the cutout portion CG of the second display area DA2.

A first organic material is dropped on the first encapsulation inorganic layer 191 of the first display area DA1 by an inkjet process to form an encapsulation organic layer 192. When the encapsulation organic layer 192 of the second display area DA2 is formed by the inkjet process, the first organic material is dropped on a central portion of the first encapsulation inorganic layer 191 disposed on the bank 180 to form the encapsulation organic layer 192 as the first organic material spreads outward from the central portion. Therefore, a thickness of the encapsulation organic layer 192 becomes thinner from the central portion thereof to the side surface thereof, and an end of the encapsulation organic layer 192 may be disposed to coincide with an end of the first encapsulation inorganic layer 191 disposed on the bank 180.

The second encapsulation inorganic layer 193 may be disposed on the encapsulation organic layer 192 of the first display area DA1 and the second display area DA2.

The second encapsulation inorganic layer 193 may be disposed on side surfaces of the second dam DAM2 and the protrusion pattern CP in the second display area DA2. That is, the second encapsulation inorganic layer 193 may be disposed on side surfaces of the substrate SUB, the first buffer layer BF1, the gate insulating layer 130, the first interlayer insulating layer 141, the second interlayer insulating layer 142, and the first planarization layer 150, like the first encapsulation inorganic layer 191. In addition, the first encapsulation inorganic layer 191 and the second encapsulation inorganic layer 193 may be disposed on the sub-substrate 100 positioned in the cutout portion CG.

Figure 15:
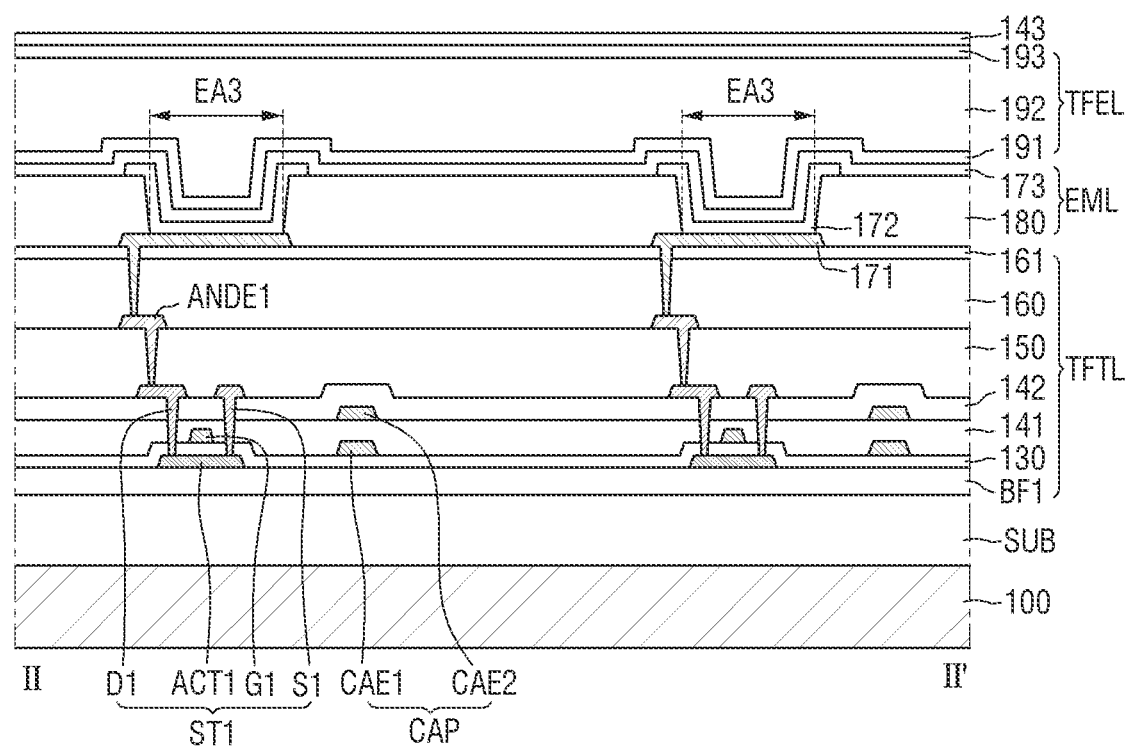
Figure 16:
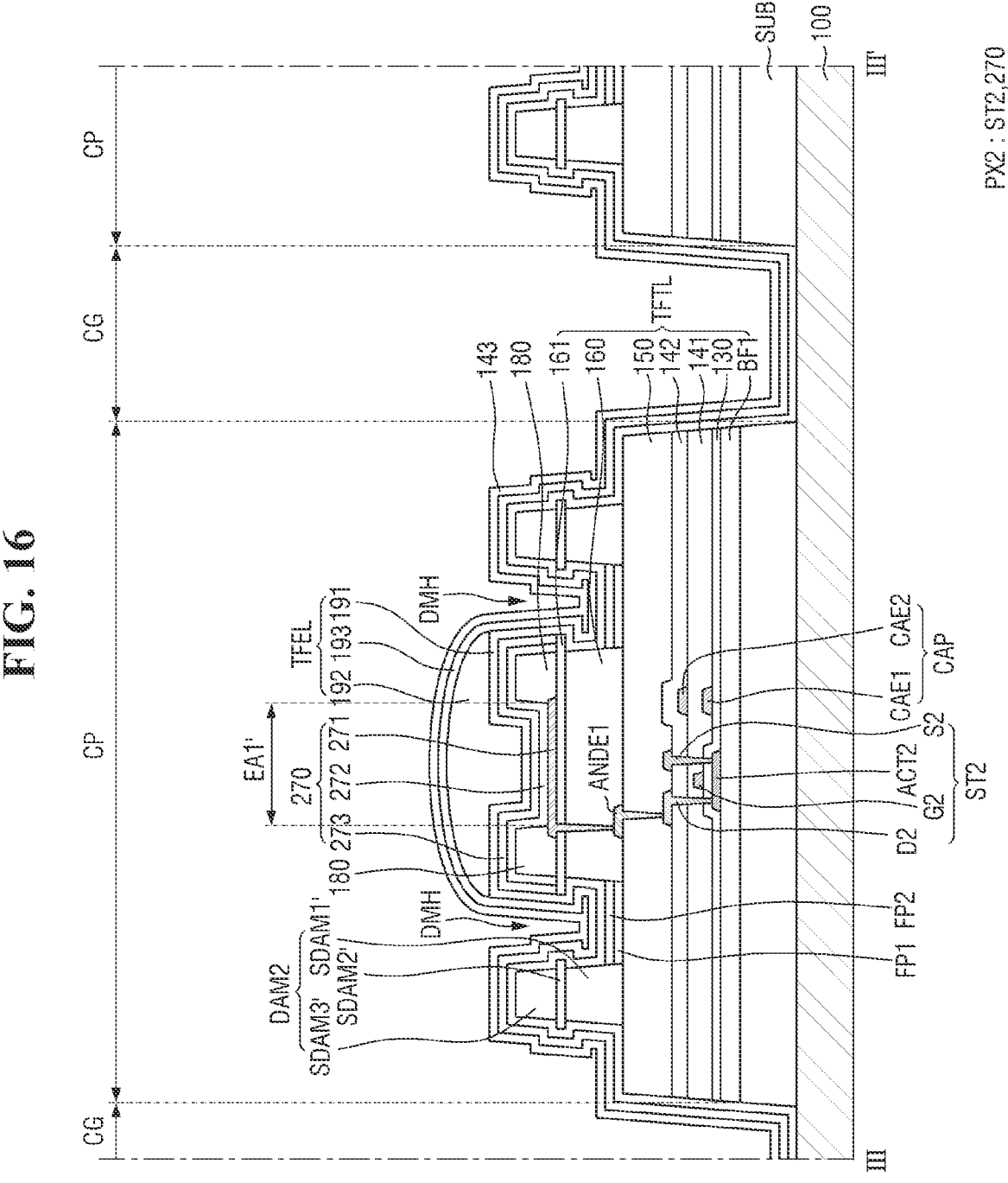
Figure 17:
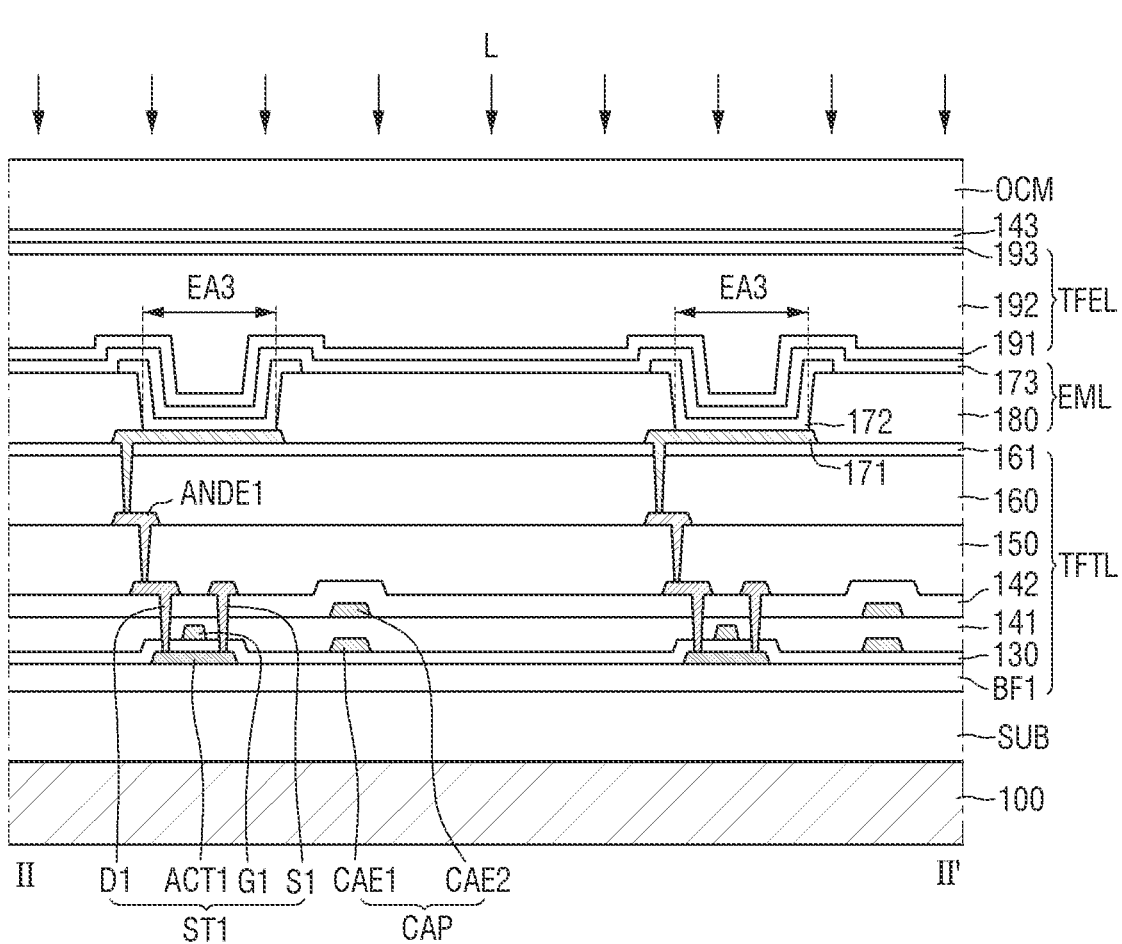

Secondly, as illustrated in FIGS. 15 and 16, a third interlayer insulating layer 143 is formed by depositing an inorganic material on the first light emitting element 170 of the first display area DA1 and the second light emitting element 270 of the second display area DA2 (see, e.g., 'S200' in FIG. 12).

The third interlayer insulating layer 143 may be disposed on the second encapsulation inorganic layer 193 of the first display area DA1 and the second encapsulation inorganic layer 193 of the second display area DA2.

In addition, the third interlayer insulating layer 143 may be disposed on the side surfaces of the second dam DAM2 and the protrusion pattern CP, and the sub-substrate 100 positioned in the cutout portion CG, in the second display area DA2 in the same manner as the second encapsulation inorganic layer 193.

Thirdly, as illustrated in FIGS. 17 to 20, a third planarization layer OC is formed on the third interlayer insulating layer 143 of the first display area DA1 and the second display area DA2 (see, e.g., 'S300' in FIG. 12).

Figure 18:
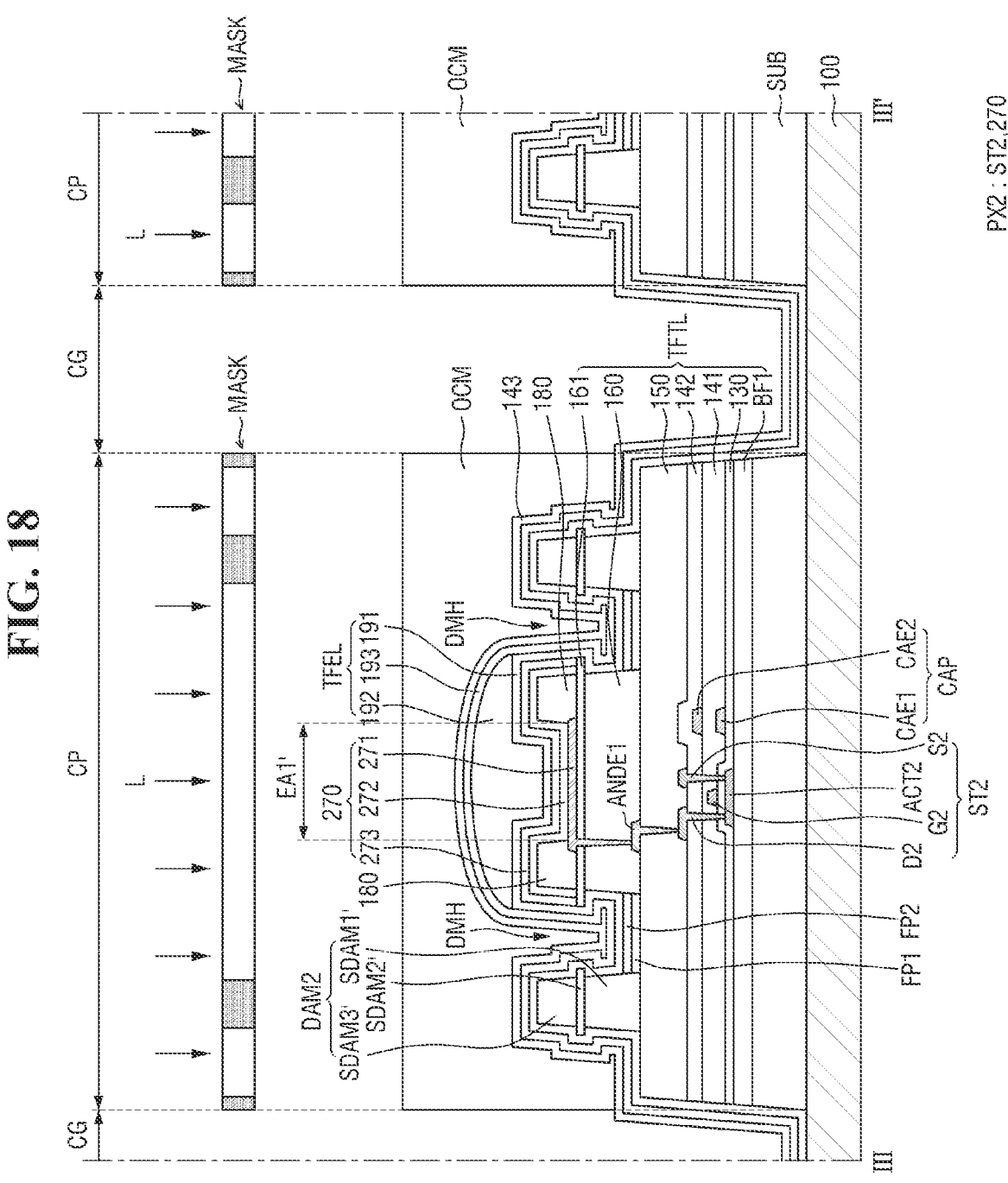
Figure 19:
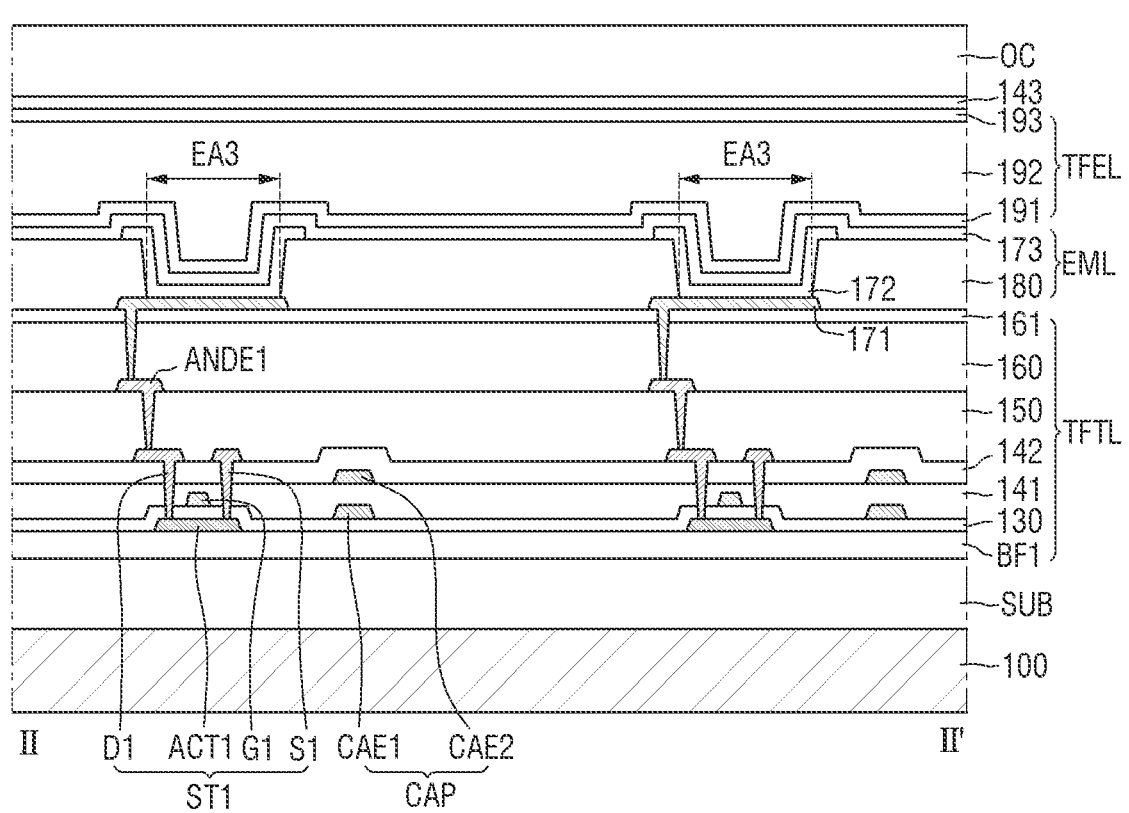
Figure 20:
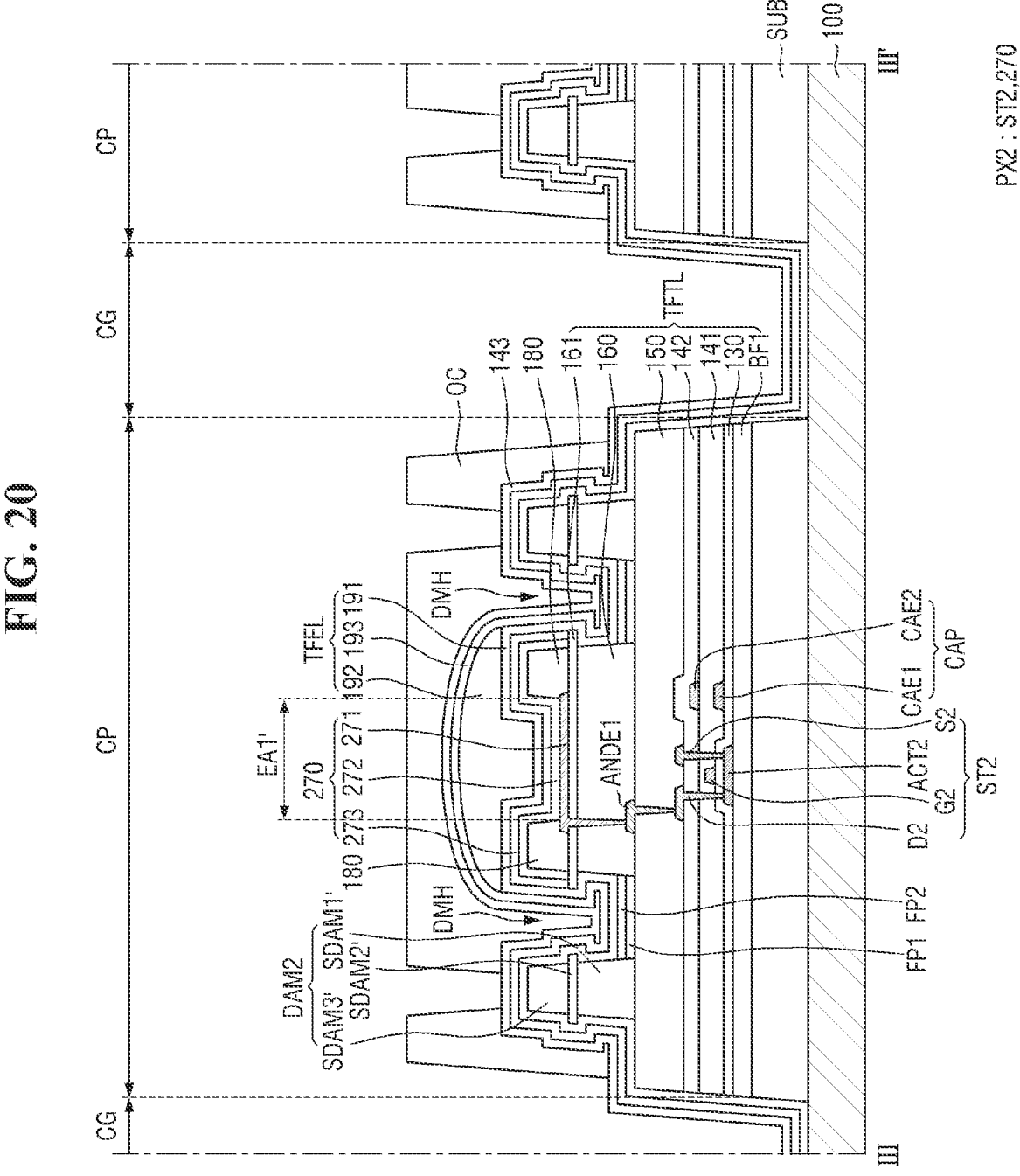

In one or more embodiments, as illustrated in FIGS. 17 to 20, the third planarization layer OC may formed by applying a second organic material OCM to an entirety of the top surface of the third interlayer insulating layer 143 except for the areas of the cutout portions CG of the first display area DA1 and the second display area DA2, disposing a mask MASK on the second organic material OCM (see, e.g., FIG. 18), and then removing a portion of the second organic material OCM (see, e.g., FIG. 20).

It is illustrated in FIG. 18 that the second organic material OCM is a negative photoresist pattern in which an unexposed area to which light L is not irradiated by being covered by the mask MASK is removed during development, but the disclosure is not limited thereto. The second organic material OCM may be a positive photoresist pattern in which an exposed area to which light L is irradiated by not being covered by the mask MASK is removed during development.

Since the encapsulation organic layer 192 is formed by the inkjet process, but the third planarization layer OC is formed by a photolithography process, the first organic material and the second organic material OCM may be formed of different materials.

Referring to FIGS. 19 and 20, the third planarization layer OC may be formed on the third interlayer insulating layer 143 of the first display area DA1 and the third interlayer insulating layer 143 of the protrusion pattern CP of the second display area DA2.

In one or more embodiments, the third planarization layer OC disposed on the third interlayer insulating layer 143 may be disposed to form a space on a top surface of the bank 180, thereby exposing the third interlayer insulating layer 143 disposed on the top surface of the bank 180, and covering at least a portion of top surface of the protrusion pattern CP disposed between the second dam DAM2 and the cutout portion CG.

Figure 21:
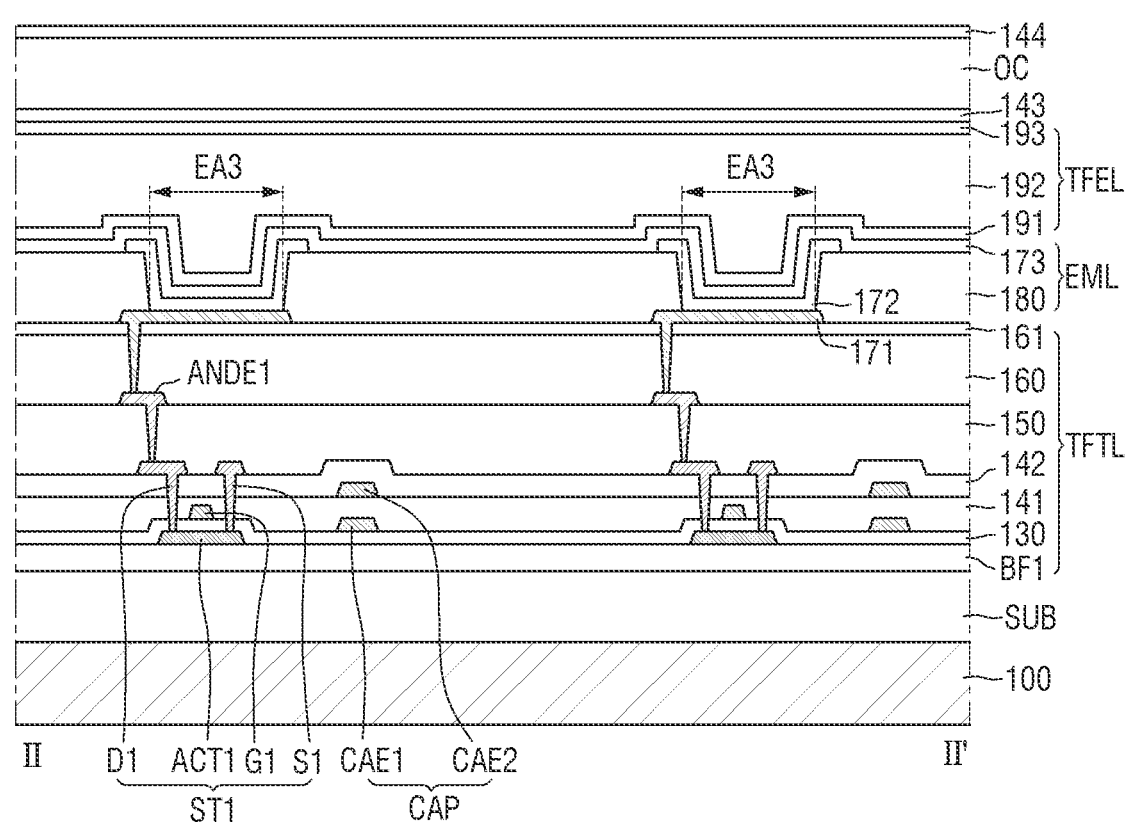
Figure 22:
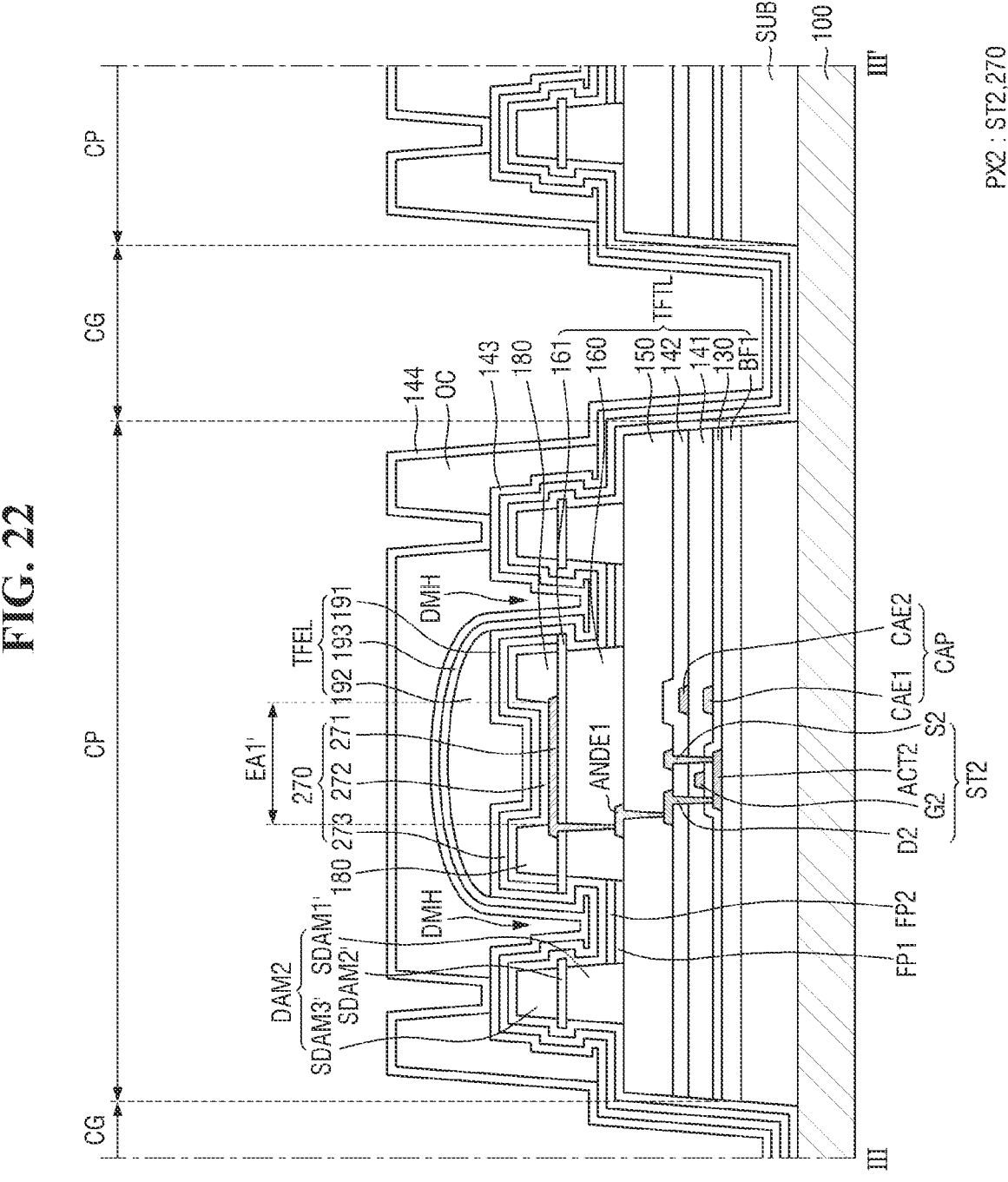

Fourthly, as illustrated in FIGS. 21 and 22, a fourth interlayer insulating layer 144 is formed by depositing an inorganic material on the third interlayer insulating layer 143 of the first display area DA1 and the second display area DA2 (see, e.g., 'S400' in FIG. 12).

In one or more embodiments, the fourth interlayer insulating layer 144 may be disposed on the third interlayer insulating layer 143 of the first display area DA1 and the third interlayer insulating layer 143 of the second display area DA2, and may be disposed on the side surfaces of the second dam DAM2 and the protrusion pattern CP and the top surface of the sub-substrate 100 disposed in the cutout portion CG in the second display area DA2 in the same manner as the third interlayer insulating layer 143.

Accordingly, the fourth interlayer insulating layer 144 may be in contact with the third interlayer insulating layer 143 disposed on the top surface of the bank 180 exposed by the third planarization layer OC and the third interlayer insulating layer 143 disposed on the side surface of the protrusion pattern CP.

In addition, the fourth interlayer insulating layer 144 may serve to protect the third planarization layer OC disposed on the protrusion pattern CP during a process of removing a sacrificial layer DOC (see, e.g., FIG. 23) disposed in the area of the cutout portion CG in a manufacturing process step (see, e.g., 'S800' in FIG. 12).

Figure 23:
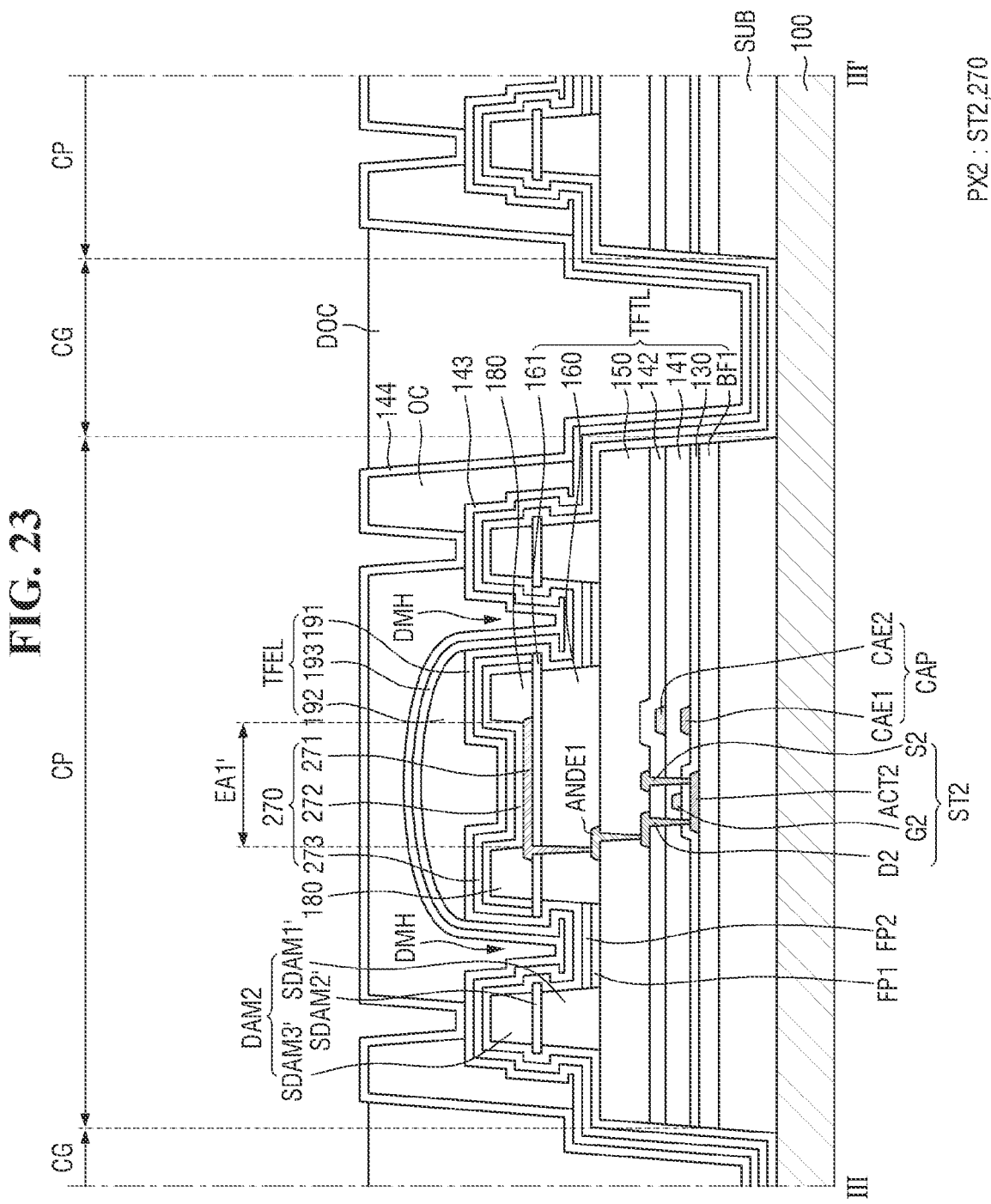

Fifthly, as illustrated in FIG. 23, a sacrificial layer DOC is formed in the cutout portion CG of the second display area DA2 (see, e.g., 'S500' in FIG. 12).

Referring to FIG. 23, in one or more embodiments, the sacrificial layer DOC may be disposed on the fourth interlayer insulating layer 144 disposed on the top surface of the sub-substrate 100 and the side surface of the protrusion pattern CP, and may cover the top surface of the sub-substrate 100 and the side surface of the protrusion pattern CP.

In one or more embodiments, the sacrificial layer DOC may be formed by filling the cutout portion CG with a material layer for a sacrificial layer, and a top surface of the sacrificial layer DOC filling the area of the cutout portion CG may have the same height as the top surface of the third planarization layer OC disposed on a cut surface of the protrusion pattern CP. However, the disclosure is not limited thereto, and the top surface of the sacrificial layer DOC may be positioned higher or lower than the top surface of the third planarization layer OC.

The sacrificial layer DOC may include the same material as the first to third planarization layers 150, 160 and OC described above. However, the disclosure is not limited thereto, and the sacrificial layer DOC may include indium zinc oxide (IZO).

Figure 24:
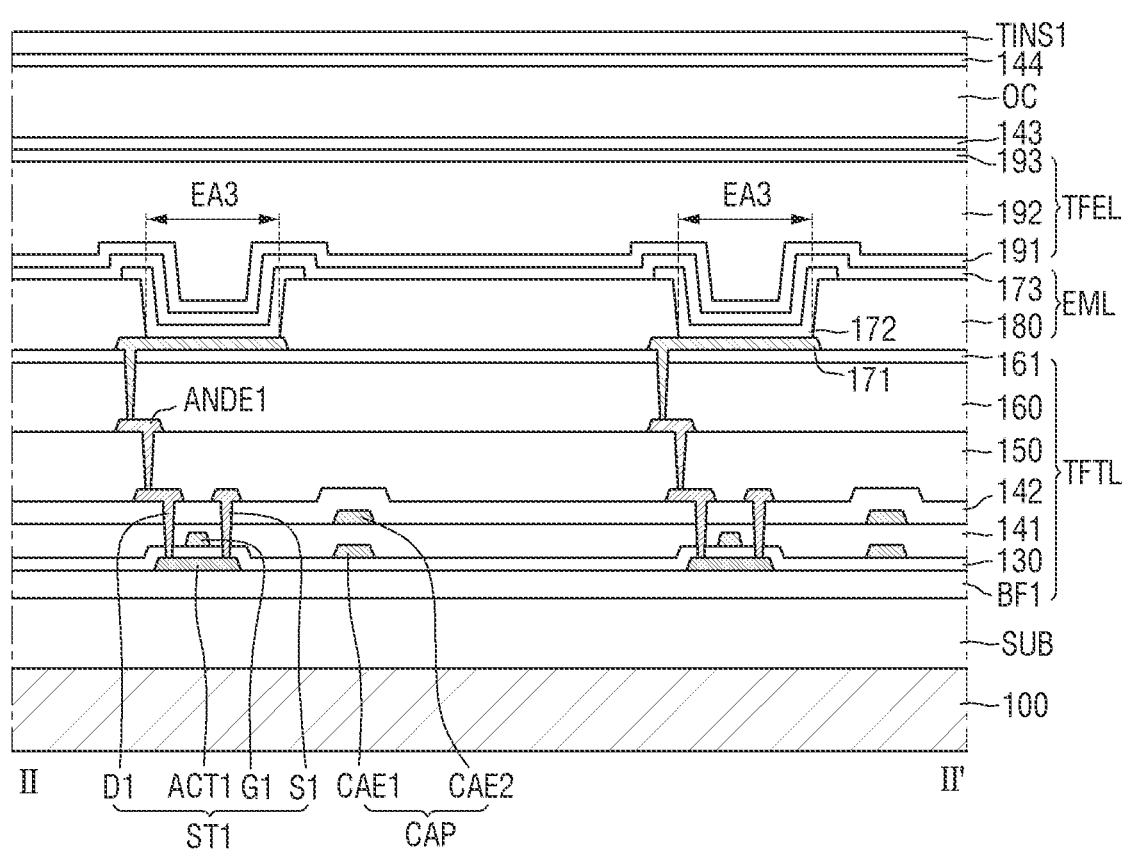
Figure 25:
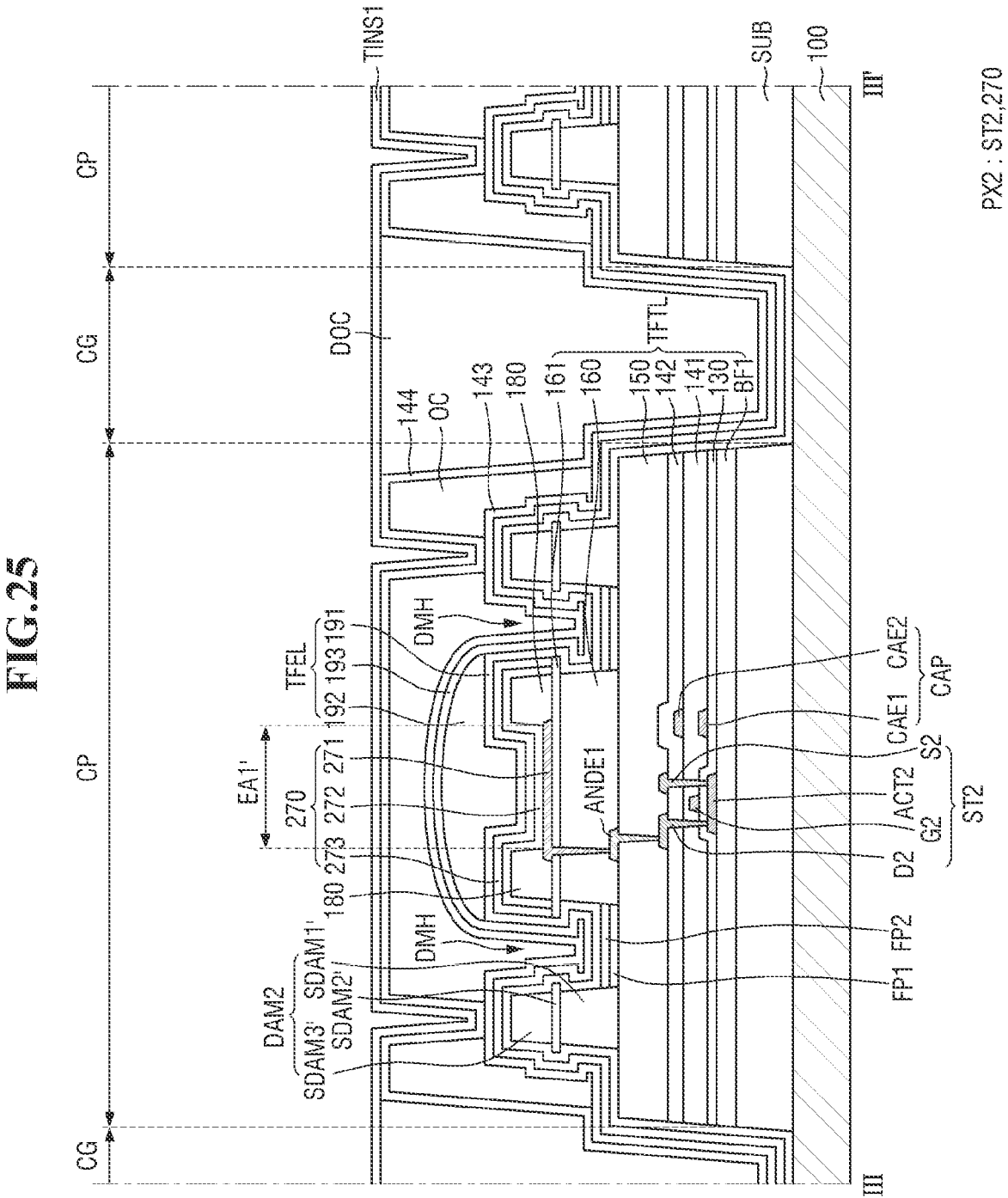

Sixthly, as illustrated in FIGS. 24 and 25, in the first display area DA1 and the second display area DA2, a first touch inorganic layer TINS1 is formed on the fourth interlayer insulating layer 144 and the sacrificial layer DOC in the cutout portion CG (see, e.g. 'S600' in FIG. 12).

Referring to FIGS. 24 and 25, the first touch inorganic layer TINS1 is disposed on the fourth interlayer insulating layer 144 and the sacrificial layer DOC in the first display area DA1 and the second display area DA2. In one or more embodiments, in the second display area DA2, the first touch inorganic layer TINS1 may be entirely disposed on the fourth interlayer insulating layer 144 disposed on the protrusion pattern CP and the top surface of the sacrificial layer DOC disposed in the cutout portion CG.

Since the first touch inorganic layer TINS1 and the fourth interlayer insulating layer 144 are in contact with each other on the protrusion pattern CP, the sacrificial layer DOC may be protected, thereby maintaining the cut surface of the protrusion pattern CP and the top surface of the cutout portion CG to be flat.

Seventhly, in the first display area DA1, a connection electrode BE1 may be formed on the first touch inorganic layer TINS1, a second touch inorganic layer TINS2 may be formed on the connection electrode BE1, and a driving electrode TE and the sensing electrode RE may be formed on the second touch inorganic layer TINS2 (see, e.g., 'S700' in FIG. 12).

The connection electrode BE1 may be formed on the first touch inorganic layer TINS1 using a photolithography process, and the second touch inorganic layer TINS2 may be formed by depositing an inorganic material on the connection electrode BE1.

Next, the driving electrode TE and the sensing electrode RE may be simultaneously formed on the second touch inorganic layer TINS2 using a photolithography process, and an organic material may be deposited on the driving electrode TE and the sensing electrode RE to form a touch organic layer TINS3, thereby completing the display panel 300 as illustrated in FIG. 3.

Figure 26:
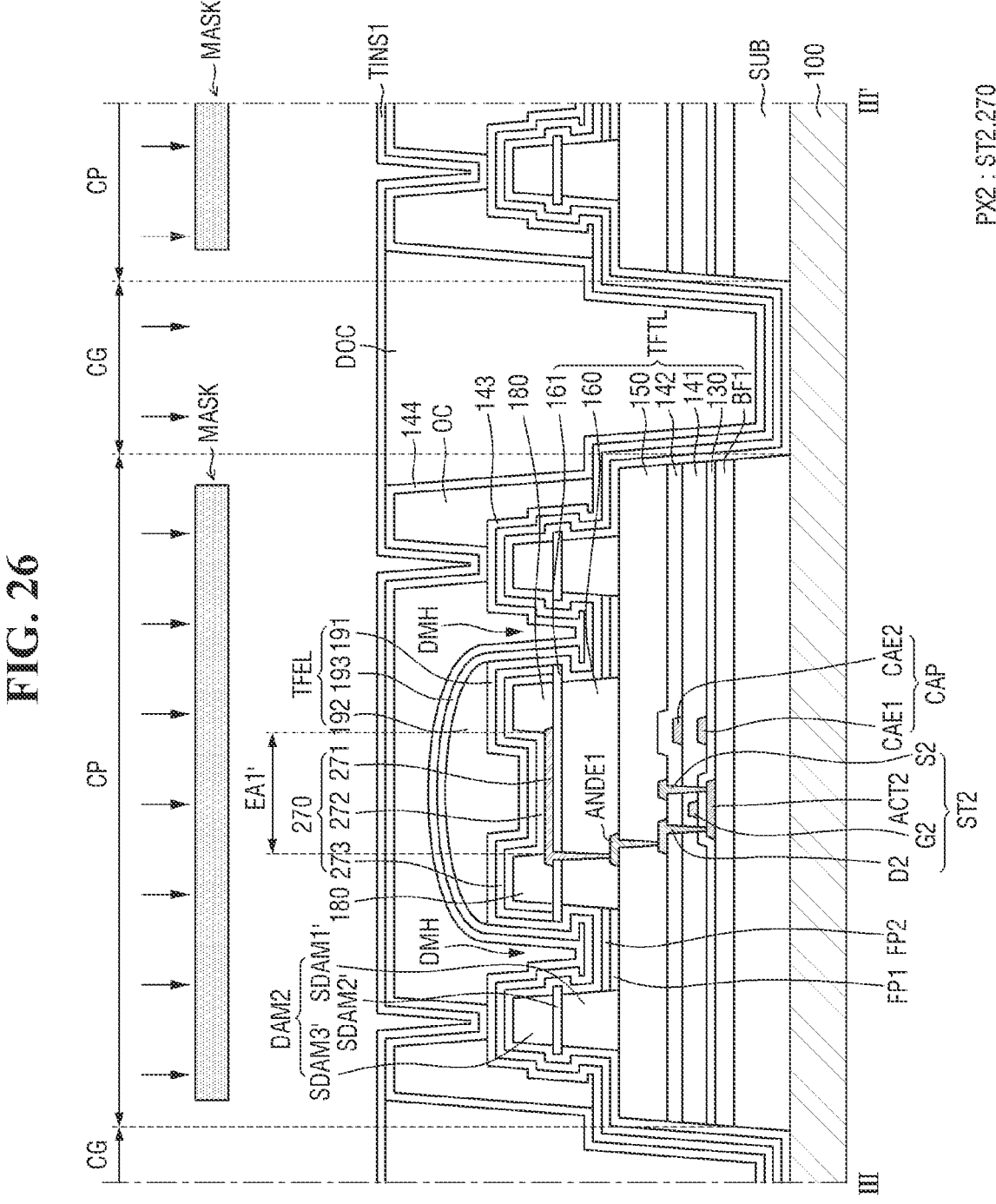
Figure 27:
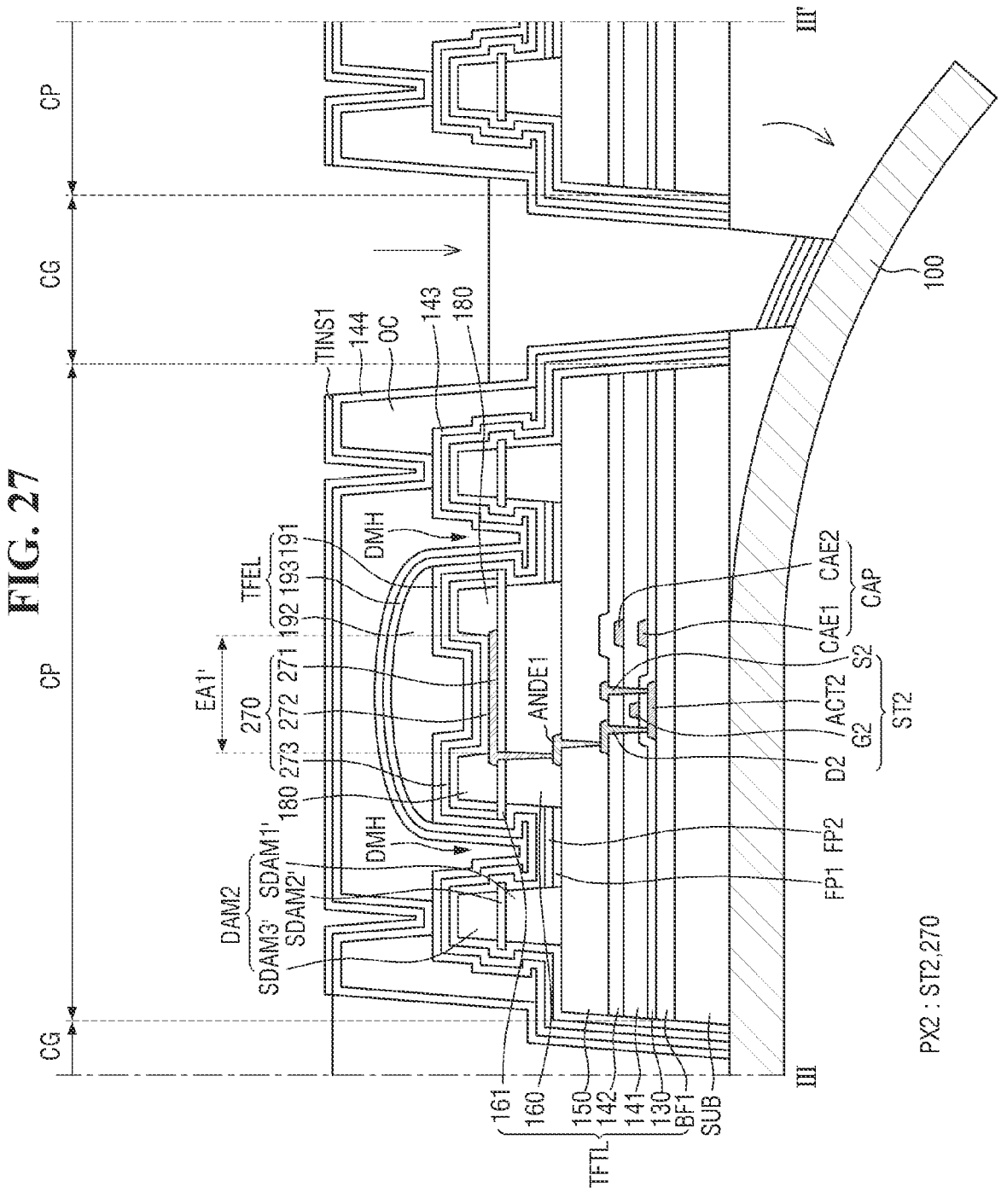

Eighthly, as illustrated in FIGS. 26 and 27, in the second display area DA2, the first touch inorganic layer TINS1 formed on the sacrificial layer DOC is etched, and the sacrificial layer DOC is removed (see, e.g., 'S800' in FIG. 12).

First, as illustrated in FIG. 26, since the mask MASK is disposed in an area corresponding to the top surface except for the outer side surface of the third planarization layer OC, the first touch inorganic layer TINS1 disposed in the area corresponding to the outer side surface of the third planarization layer OC and the cutout portion CG may be exposed.

Thereafter, the first touch inorganic layer TINS1 disposed in an area where the mask MASK is not disposed is selectively etched. Accordingly, an end of the fourth interlayer insulating layer 144 disposed on the top surface of the third planarization layer OC coincides with an end of the first touch inorganic layer TINS1, and the first touch inorganic layer TINS1 disposed on the top surface of the sacrificial layer DOC filled in the cutout portion CG is removed by etching.

Next, referring to FIG. 27, the sub-substrate 100 disposed on a bottom surface of the substrate SUB is removed.

In one or more embodiments, the sub-substrate 100 is detached from the substrate SUB. The detachment process of the sub-substrate 100 may be performed after irradiating a surface of the substrate SUB with a laser through a laser device or the like, and then weakening a bonding force between the substrate SUB and the sub-substrate 100.

As such, when the sub-substrate 100 is detached from the substrate SUB, the components disposed on the cut surface of the protrusion pattern CP may be supported by the substrate SUB, but since the first encapsulation inorganic layer 191, the second encapsulation inorganic layer 193, the third interlayer insulating layer 143, the fourth interlayer insulating layer 144, and the sacrificial layer DOC disposed on the top surface of the sub-substrate 100 in the area of cutout portion CG may not be supported any longer, these components may be removed together with the detachment of the sub-substrate 100. However, the first encapsulation inorganic layer 191, the second encapsulation inorganic layer 193, the third interlayer insulating layer 143, and the fourth interlayer insulating layer 144 disposed on the side surface of the protrusion pattern CP are not removed.

Thereafter, in order to remove the sacrificial layer DOC remaining on the side surface of the protrusion pattern CP, the remaining sacrificial layer DOC may be removed by a wet method using a liquid such as a stripper. At the same time, the remaining sacrificial layer DOC may also be removed together while cleaning is performed using a cleaning solution.

The method of removing the sacrificial layer DOC filling the cutout portion CG is not limited thereto, and the sacrificial layer DOC may be removed by various methods known in the art, such as lift-off.

Hereinafter, a method of manufacturing a display device according to one or more embodiments will be described in detail. In the following embodiments, a description for the same steps as those of the embodiment described above will be omitted or simplified, and differences will be mainly described.

Figure 28:
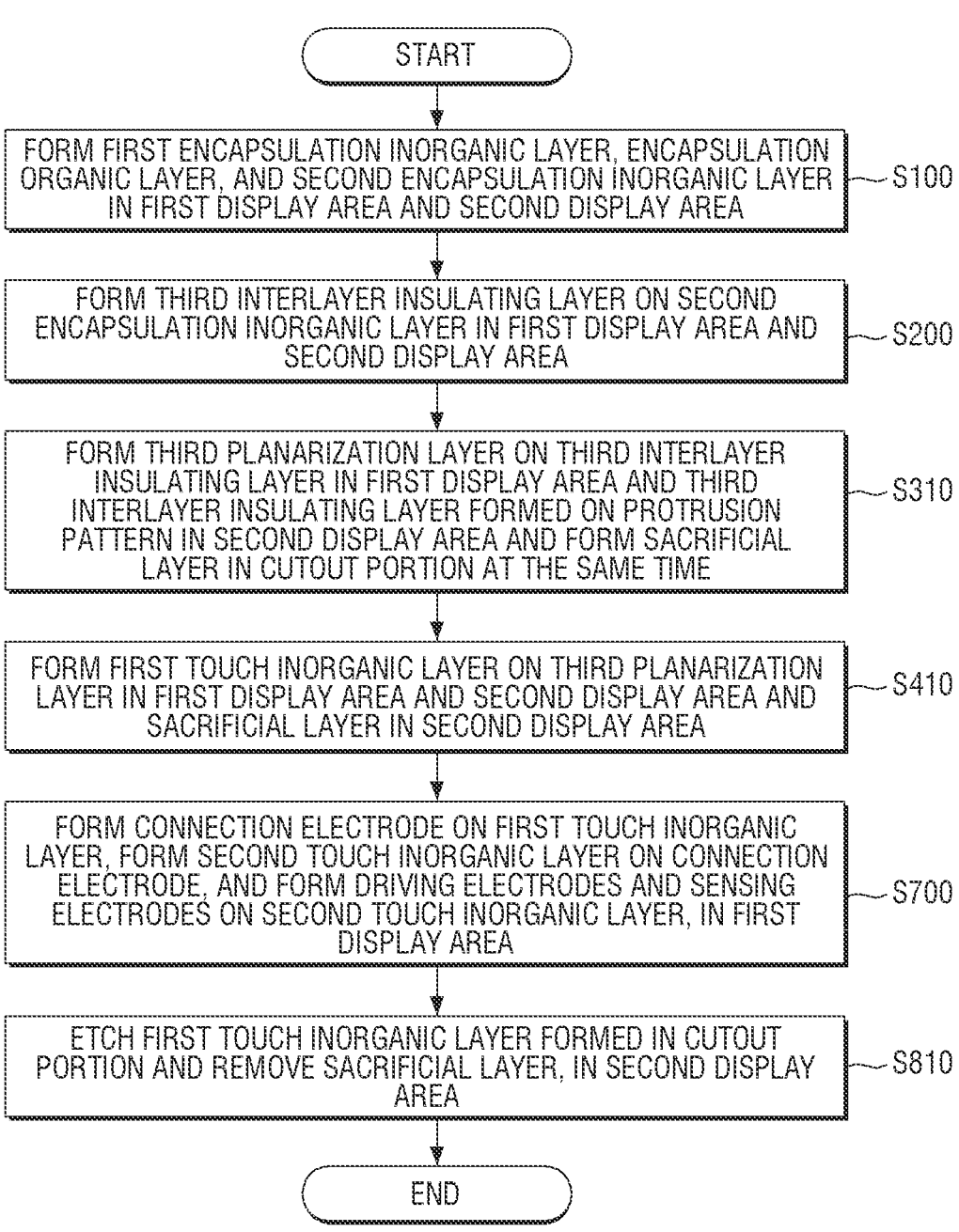
FIG. 28 is a flowchart illustrating a method of manufacturing the display device according to one or more embodiments.

FIG. 28 is a flowchart illustrating a method of manufacturing a display device according to one or more embodiments. FIGS. 29 to 33 are cross-sectional views for describing the method of manufacturing a display device according to one or more embodiments.

FIGS. 29 to 33 are cross-sectional views illustrating another example of the display panel taken along line III-III' of FIG. 7.

Referring to FIG. 28, the embodiment is different from the embodiment of FIG. 12 in that step (see, e.g., 'S400' in FIG. 12) of forming the fourth interlayer insulating layer 144 on the third interlayer insulating layer 143 in the first display area DA1 and the second display area DA2, and step (see, e.g., 'S500' in FIG. 12) of forming the sacrificial layer DOC in the cutout portion CG in the second display area DA2 after forming the fourth interlayer insulating layer 144 are omitted, the third planarization layer OC is formed on the protrusion pattern CP and the sacrificial layer DOC is formed in the cutout portion CG at the same time, in the second display area DA2 (see, e.g., 'S310' in FIG. 28), and the first touch inorganic layer TINS1 is directly formed on the third planarization layer OC and the sacrificial layer DOC (see, e.g., 'S410' in FIG. 28).

As such, when the third planarization layer OC is formed on the protrusion pattern CP and the sacrificial layer DOC is formed in the cutout portion CG at the same time, in the second display area DA2, the manufacturing process steps may be simplified to improve an efficiency of the manufacturing process.

Figure 29:
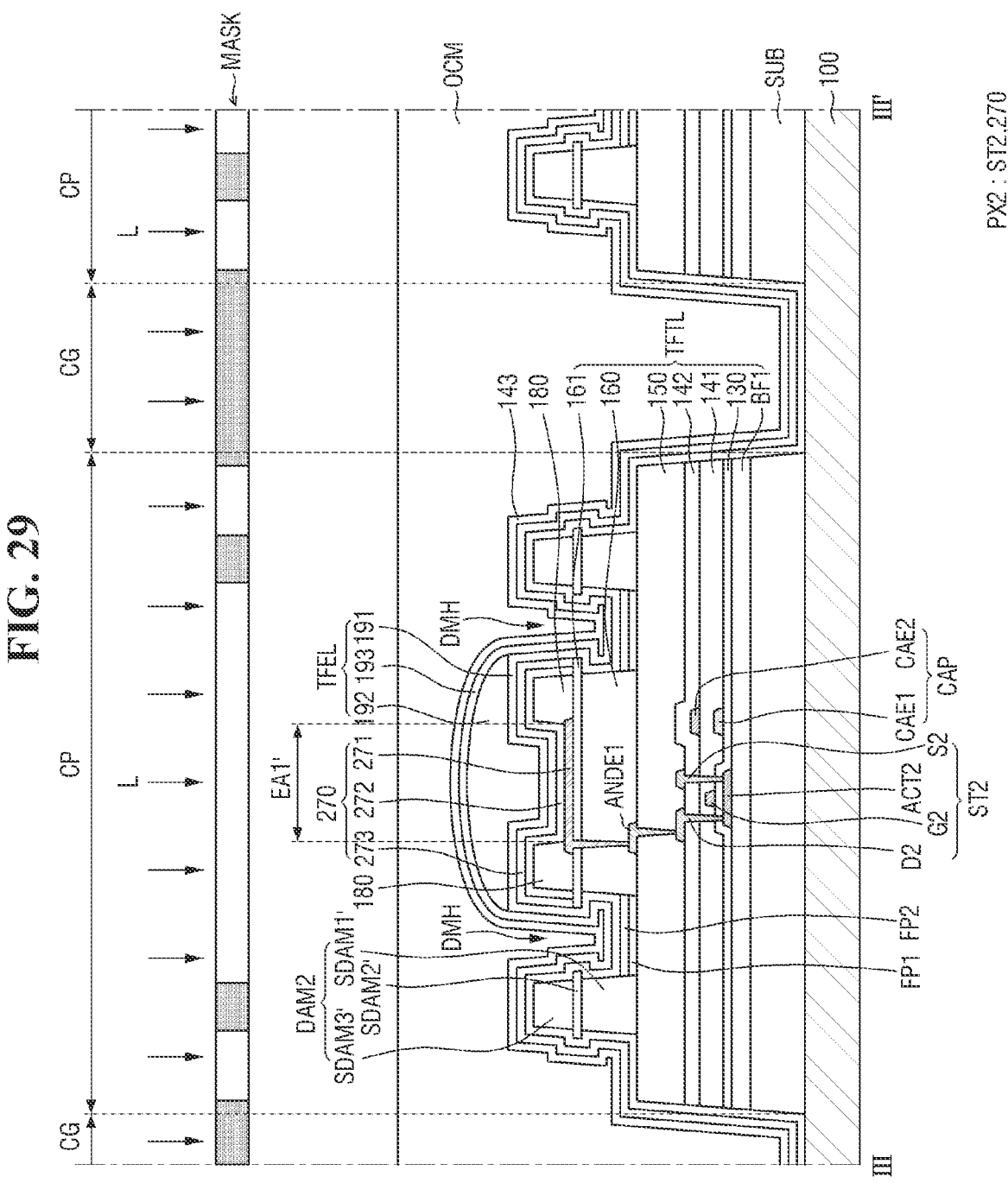

Referring to FIG. 29, the step (see, e.g., 'S310' in FIG. 28) of forming the third planarization layer OC on the protrusion pattern CP and forming the sacrificial layer DOC in the cutout portion CG at the same time, in the second display area DA2, has differences in that the second organic material OCM is applied to the cutout portion CG and a space on an upper side of the cutout portion CG, and a mask MASK is disposed on the protrusion pattern CP and the area of the cutout portion CG, unlike the step (see, e.g., 'S300' in FIG. 12) of forming the third planarization layer OC by applying the second organic material OCM to the area except for the cutout portion CG and disposing the mask MASK on an area where the second organic material OCM is disposed.

Figure 30:
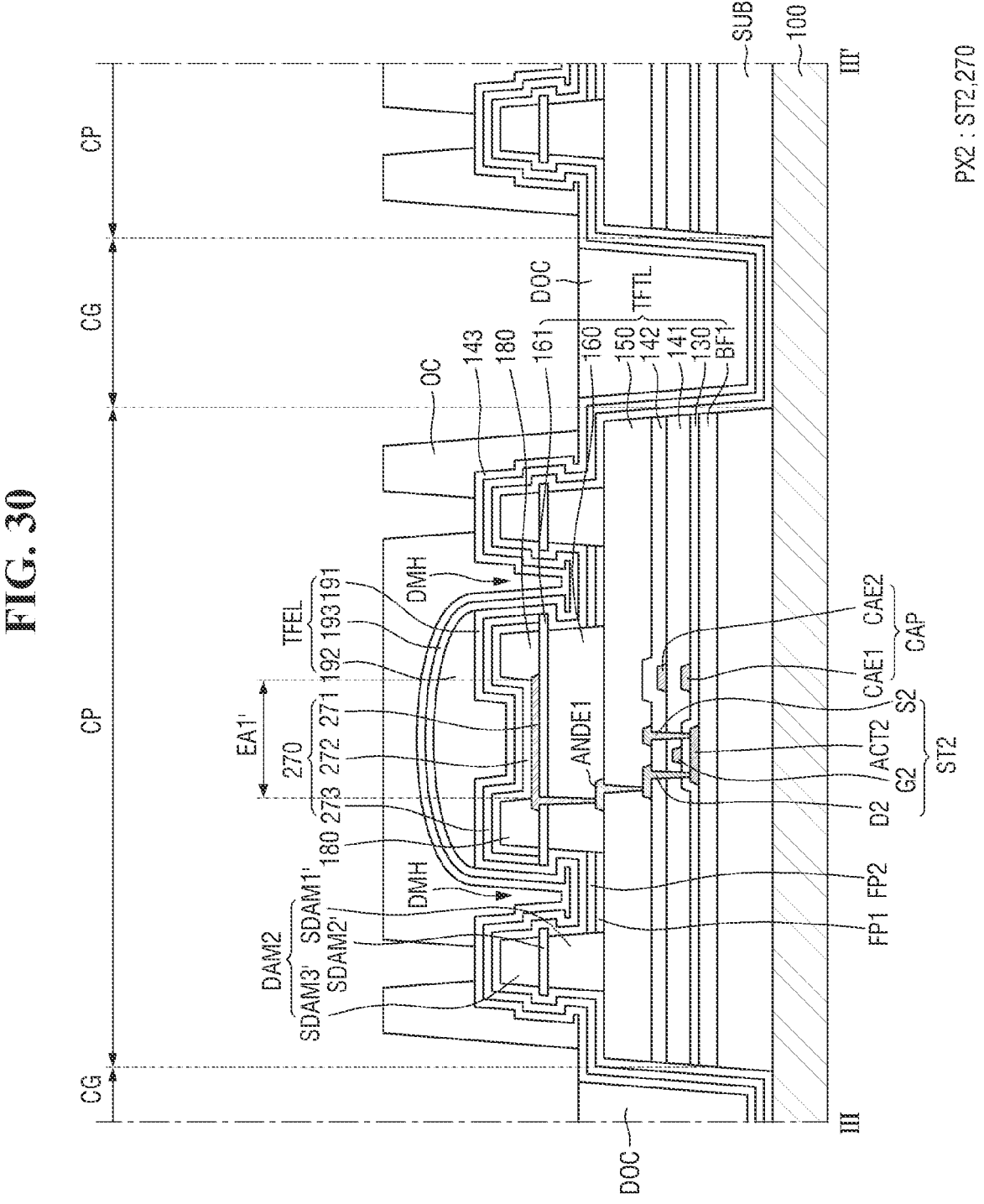

In addition, unlike the embodiment according to FIGS. 22 and 23 in which the fourth interlayer insulating layer 144 is formed on the third planarization layer OC and the third interlayer insulating layer 143 disposed in the cutout portion CG, and then the sacrificial layer DOC is formed in the cutout portion CG and the area above the cutout portion CG, the embodiment according to FIG. 30 has differences in that the third planarization layer OC and the sacrificial layer DOC are simultaneously formed, but the sacrificial layer DOC is formed only in the cutout portion CG except for the area above the cutout portion CG.

Figure 31:
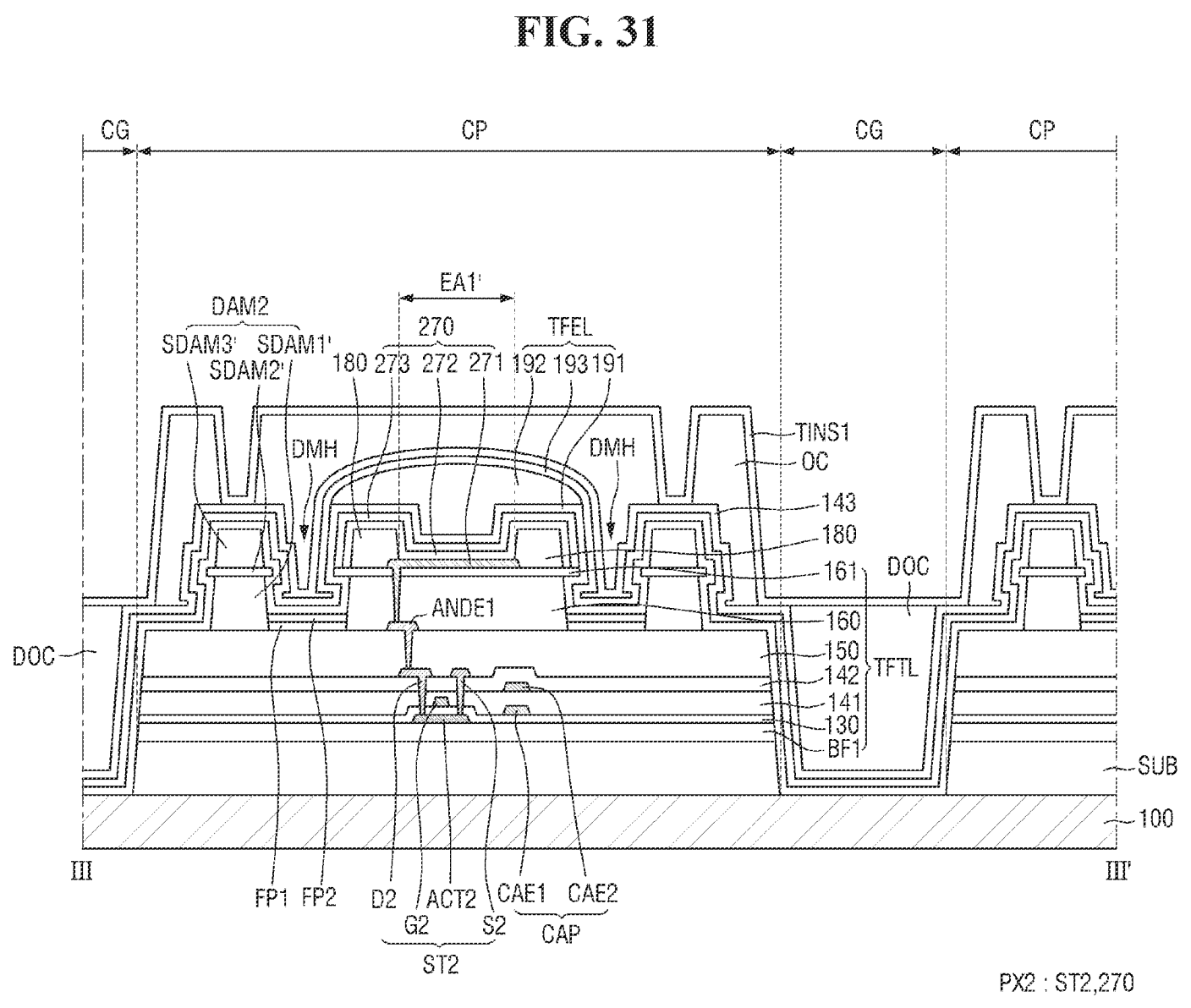
Figure 32:
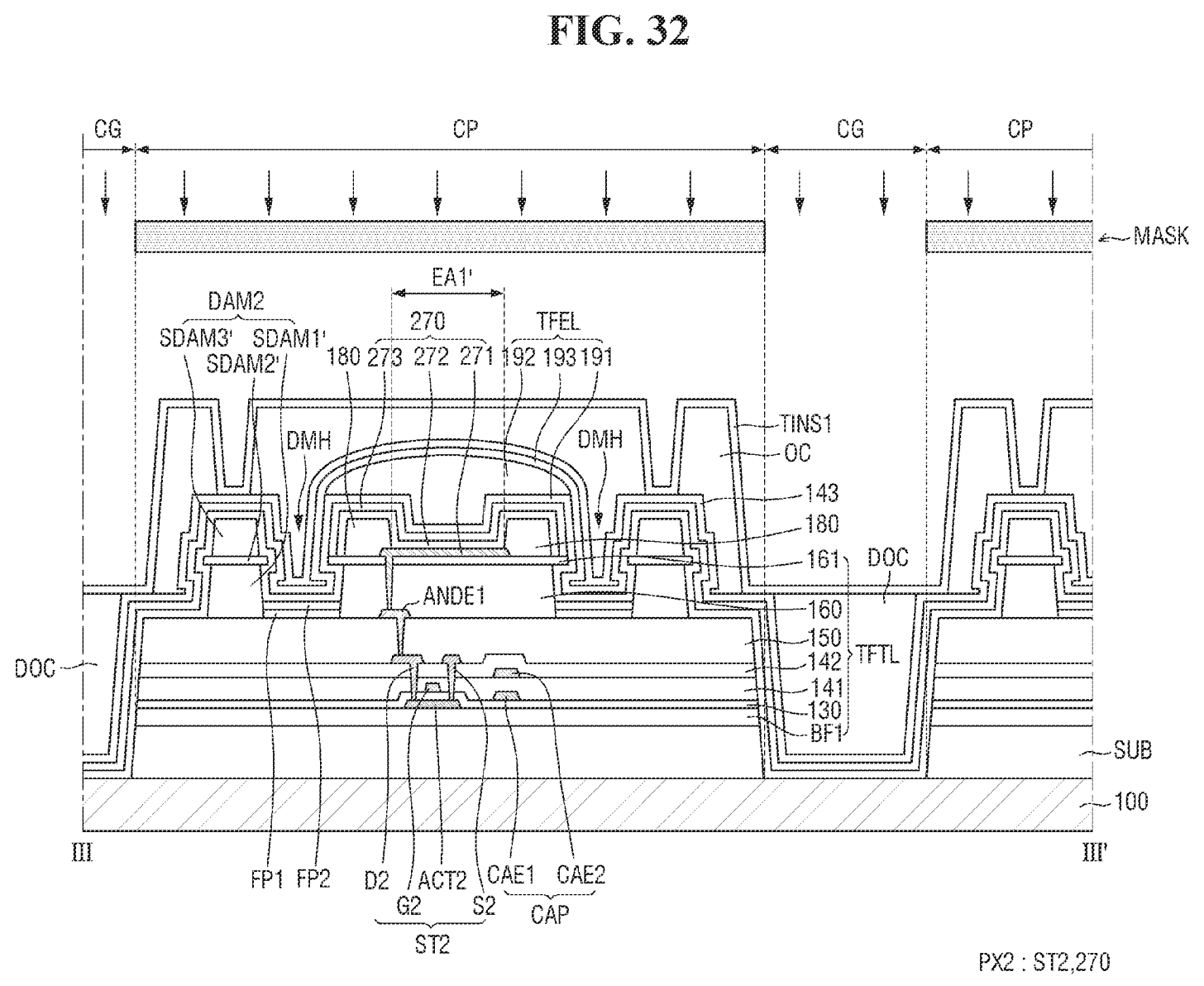

Next, unlike the embodiment according to FIG. 26 in which the first touch inorganic layer TINS1 is formed on the fourth interlayer insulating layer 144 and the sacrificial layer DOC, and the mask MASK is then disposed on the protrusion pattern CP in order to selectively etch the first touch inorganic layer TINS1 disposed in the area above the cutout portion CG, a step (see, e.g., 'S410' in FIG. 28) of forming the first touch inorganic layer TINS1 on the third planarization layer OC and the sacrificial layer DOC in the second display area DA2 and a step (see, e.g., 'S810' in FIG. 28) of etching the first touch inorganic layer TINS1 formed in the cutout portion CG in the second display area DA2 and removing the sacrificial layer DOC have differences in that the first touch inorganic layer TINS1 is directly formed on the top surface and the side surface of the third planarization layer OC, and the sacrificial layer DOC and the mask MASK is then disposed only on the area except for the cutout portion CG in order to selectively etch the first touch inorganic layer TINS1 disposed in the cutout portion CG (see, e.g., FIGS. 31-32).

Through the above steps, the display panel 300 according to another embodiment may not include the fourth interlayer insulating layer 144, the first touch inorganic layer TINS1 may be directly disposed on the top surface and the side surface of the third planarization layer OC, and the first encapsulation inorganic layer 191, the second encapsulation inorganic layer 193, and the third interlayer insulating layer 143 may be sequentially disposed on the side surface of the substrate SUB, the first buffer layer BF1, the gate insulating layer 130, the first interlayer insulating layer 141, the second interlayer insulating layer 142, and the first planarization layer 150 included in the protrusion pattern CP.

Even when a step is formed in the display panel 300 including the cutout portion CG, a sensor electrode may be formed by using the photolithography process and the thin film process even after forming the cutout portion CG in the display panel 300 by forming the third planarization layer OC and the sacrificial layer DOC on the protrusion pattern CP and the cutout portion CG, respectively, through the manufacturing processes as described above. As a result, reliability of the display device 10 may be improved by solving problems such as poor coating of the organic layer and formation of a residual layer on the step of the cutout portion CG.

In concluding the detailed description, those skilled in the art will appreciate that many variations and modifications can be made to the illustrative embodiments without substantially departing from the principles of the present disclosure. Therefore, the disclosed illustrated embodiments of the present disclosure are used in a generic and descriptive sense only and not for purposes of limitation.

What is claimed is:

1. A display device comprising:
   a substrate comprising a main portion and a plurality of protrusion patterns protruding outwardly from an edge of the main portion;
   a display layer on each of the protrusion patterns;
   a first insulating layer covering the display layer; and
   a second insulating layer on the first insulating layer,
   wherein adjacent protrusion patterns of the plurality of protrusion patterns are separated by a cutout portion therebetween in a plan view and side surfaces of the adjacent protrusion patterns face each other, wherein the first insulating layer covers a top surface of the display layer on each of the protrusion patterns, wherein the first insulating layer comprises adjacent first insulating layers on the adjacent protrusion patterns that face each other and are separated by the cutout portion therebetween in the plan view, wherein the second insulating layer is on a top surface of the first insulating layer on each of the protrusion patterns, and wherein the second insulating layer is not on a side surface of the display layer.

2. The display device of claim 1, wherein the first insulating layer further covers a side surface of the display layer on each of the protrusion patterns.

3. The display device of claim 1, wherein the cutout portion extends in a direction parallel to an extension direction of the adjacent protrusion patterns adjacent to the cutout portion.

4. The display device of claim 1, wherein the display layer is further on the main portion, wherein the first insulating layer is on the top surface of the display layer on the main portion, and wherein the second insulating layer is on the first insulating layer on the main portion.

5. The display device of claim 4, wherein the display layer comprises a plurality of pixels, and wherein an arrangement of the plurality of pixels of the display layer on the main portion and an arrangement of the plurality of pixels on the plurality of protrusion patterns are different from each other.

6. The display device of claim 5, wherein the display layer comprises a thin film transistor layer and a light emitting element on the thin film transistor layer.

7. The display device of claim 6, wherein the display layer comprises one or more inorganic insulating layers and one or more organic insulating layers.

8. The display device of claim 7, wherein the display layer further comprises a dam portion around the plurality of pixels on the protrusion patterns, and wherein the dam portion comprises at least one insulating layer selected from the one or more inorganic insulating layers and the one or more organic insulating layers.

9. The display device of claim 6, wherein the display layer further comprises a planarization layer on an upper side of the light emitting element, and wherein the first insulating layer is at least partially in contact with a top surface of the planarization layer.

10. The display device of claim 4, further comprising a touch electrode, wherein at least a portion of the touch electrode is on the second insulating layer on the main portion.

11. The display device of claim 10, wherein the touch electrode is not on the protrusion patterns.

12. The display device of claim 1, wherein the first insulating layer covers one side surface of each of the plurality of protrusion patterns.

13. The display device of claim 1, wherein the first insulating layer comprises a first area covering the top surface of the display layer and a second area covering a side surface of the display layer, and wherein an edge of a top surface of the second insulating layer is aligned with a boundary between the first area and the second area of the first insulating layer.

14. The display device of claim 1, wherein the main portion comprises a plurality of edges and corner portions where the plurality of edges meet, and wherein the plurality of protrusion patterns protrude from the corner portions of the main portion.

15. The display device of claim 14, wherein the substrate comprises a flat portion positioned in a center of the main portion, wherein a single bending portion is bent downwardly from each edge of the flat portion, wherein a multi bending portion is at a position where the single bending portions adjacent to each other meet, and wherein the protrusion patterns are positioned in the multi bending portion.

16. The display device of claim 15, wherein the side surfaces of the adjacent protrusion patterns are in contact with each other.

* * * * *